(12) United States Patent
Campos et al.

(10) Patent No.: US 9,727,689 B2
(45) Date of Patent: Aug. 8, 2017

(54) SYSTEM AND METHOD FOR WIRING AN AIRCRAFT

(71) Applicant: The Boeing Company, Chicago, IL (US)

(72) Inventors: Alfredo Z. Campos, Snohomish, WA (US); Robert Thomas Johnson, Everett, WA (US); Robert William Kennedy, Jr., Kent, WA (US)

(73) Assignee: THE BOEING COMPANY, Chicago, IL (US)

( * ) Notice: Subject to any disclaimer, the term of this patent is extended or adjusted under 35 U.S.C. 154(b) by 539 days.

(21) Appl. No.: 14/457,514

(22) Filed: Aug. 12, 2014

(65) Prior Publication Data
US 2016/0048631 A1    Feb. 18, 2016

(51) Int. Cl.
G06F 17/50    (2006.01)
(52) U.S. Cl.
CPC ........ G06F 17/5095 (2013.01); G06F 17/509 (2013.01)
(58) Field of Classification Search
None
See application file for complete search history.

(56) References Cited

U.S. PATENT DOCUMENTS

| 2003/0006779 | A1* | 1/2003 | Youval | G06F 17/509 324/503 |
| 2012/0022835 | A1* | 1/2012 | Brule | G06F 17/5095 703/1 |
| 2012/0271596 | A1* | 10/2012 | Hadley | G06F 17/5095 703/1 |
| 2013/0304426 | A1 | 11/2013 | Sciarra et al. | |

* cited by examiner

Primary Examiner — Craig Dorais
(74) Attorney, Agent, or Firm — Yee & Associates, P.C.

(57) ABSTRACT

A method and apparatus for establishing a wire network for a platform. The apparatus for establishing a wire network for an aircraft comprises a wire manager and a layout manager. The wire manager sorts a plurality of wires for the aircraft into a plurality of bundles based on a plurality of categories established for the plurality of wires with respect to operation of the aircraft. The plurality of categories includes an essential category and the plurality of bundles includes a primary bundle corresponding to the essential category. The layout manager generates a primary layout output for the primary bundle based on an available space within the aircraft. Forming and installing a primary wire harness corresponding to the primary bundle in the aircraft based on the primary layout output independently of a remaining portion of the plurality of bundles improves a build efficiency of the aircraft.

20 Claims, 15 Drawing Sheets

FIG. 11B

| | | | | | | | | |
|---|---|---|---|---|---|---|---|---|
| A1 | | | | | | | | |
| A1 | | | | | | | | |
| A1 | | | | | | | | |
| A1 | 3 | 1511 | | | 0.24 | 0.20 | HG4585DK | 1340 | 3 |
| A1 | 3 | 1511 | | | | 0.17 | HG3217DK | 1340 | 3 |
| A1 | 3 | 1511 | LS00798 | 0.16 | | 0.05 | HG3879DK | 1340 | 3 |
| A1 | 3 | 1511 | LS10714 | 0.00 | | 0.14 | | | |
| A1 | 3 | 1511 | LS00725 | 0.16 | 0.33 | | | | |
| A1 | 3 | 1511 | LS00756 | 0.13 | 0.31 | | | | |
| A1 | 3 | 1511 | LS00757 | 0.00 | | | | | |
| A1 | 3 | 1511 | LS00741 | 0.16 | | | | | |
| A1 | | | | | 0.27 | | | | |
| A1 | 3 | 1600 | XD48924 | 0.14 | 0.17 | 0.17 | | | |
| A1 | 3 | 1665 | HG7863DK | 0.14 | 0.21 | | | | |
| A1 | 3 | 1665 | HG7552DK | 0.14 | 0.17 | | | | |
| A1 | | | | | | | | | |
| A1 | 3 | 1912 | HG7342DK | 0.14 | 0.15 | 0.15 | LS10257 | 1560 | 3 |
| A1 | 3 | 1912 | XD45924 | 0.14 | 0.22 | 0.15 | LS10789 | 1560 | 3 |
| A1 | 3 | 1912 | HG7895DK | 0.14 | | | | | |

SYSTEM AND METHOD FOR WIRING AN AIRCRAFT

BACKGROUND INFORMATION

1. Field:

The present disclosure relates generally to wires and, in particular, to the installation of wires in an aircraft. Still more particularly, the present disclosure relates to a method and apparatus for establishing a wire network in an aircraft based on levels of relative importance for the wires with respect to the operation of the aircraft.

2. Background:

A platform, such as an aircraft, may have many electrical systems, each of which may require one or more wires for operation. For example, a single electrical system in an aircraft may require one wire, ten wires, twenty wires, fifty wires, one hundred wires, or some other number of wires. Typically, within an aircraft, different groups of wires are bound together in the form of wire harnesses. A wire harness is an assembly of multiple wires that may be bound together using, for example, without limitation, straps, wire ties, wire lacing, sleeves, electrical tape, string, some other type of binding element, or some combination thereof.

Wire harnesses may constrain the wires together to improve the usage of space within the aircraft. Further, wire harnesses may help better secure wires against vibrations during flight. Additionally, installing a wire harness as compared to each of the loose wires within the wire harness may allow the installation process to be more easily standardized and may reduce overall installation times.

However, the complexity of electrical systems being used in aircraft is increasing. Further, these electrical systems are being increasingly integrated with each other. As the complexity and integration of these electrical systems increase, the number of electrical wires required for these electrical systems may also increase.

With some currently available methods for forming and installing wire harnesses, the different types of wires needed for different electrical systems may not be differentiated. For example, wires that are essential to flight may not be differentiated from wires that are not essential to flight. Wires that are essential to flight may include, for example, but are not limited to, wires related to the continued safe flight and landing of the aircraft. Wires that non-essential to flight may include, for example, but are not limited to, wires related to the commercial features of the aircraft.

Without differentiating between these different types of wires, wire harnesses may be formed according to the strictest electrical separation requirements, space requirements, and other types of requirements of the wires in the wire harnesses. Consequently, a larger volume of space than desired may be required for some of these wire harnesses. Further, the overall weight of the wire network formed may be greater than desired. In some cases, not being able to readily differentiate wires essential to flight from wires not essential to flight within the different wire harnesses may increase aircraft certification times and aircraft maintenance times more than desired.

Additionally, the significant cost, time, and effort associated with designing the physical layouts for the wire harnesses to be installed within an aircraft may deter some human operators from designing these types of layouts early in the design and manufacturing process. In some cases, these human operators may determine the physical layouts to be used at the time of installation of the wire harnesses. However, with some currently available techniques, the time needed to determine these physical layouts may be greater than desired. Therefore, it would be desirable to have a method and apparatus that take into account at least some of the issues discussed above, as well as other possible issues.

SUMMARY

In one illustrative embodiment, an apparatus for establishing a wire network for an aircraft comprises a wire manager and a layout manager. The wire manager sorts a plurality of wires for the aircraft into a plurality of bundles based on a plurality of categories established for the plurality of wires with respect to operation of the aircraft. The plurality of categories includes an essential category and the plurality of bundles includes a primary bundle corresponding to the essential category. The layout manager generates a primary layout output for the primary bundle based on an available space within the aircraft. Forming and installing a primary wire harness corresponding to the primary bundle in the aircraft based on the primary layout output independently of a remaining portion of the plurality of bundles improves a build efficiency of the aircraft.

In another illustrative embodiment, a method for establishing a wire network in an aircraft is provided. A plurality of wires for the aircraft is sorted into a plurality of bundles based on a plurality of categories established for the plurality of wires with respect to operation of the aircraft. The plurality of categories includes an essential category. A primary layout output is generated for a primary bundle in the plurality of bundles corresponding to the essential category based on an available space within the aircraft. Forming and installing a primary wire harness corresponding to the primary bundle in the aircraft based on the primary layout output independently of a remaining portion of the plurality of bundles improves a build efficiency of the aircraft.

In yet another illustrative embodiment, a method for establishing a wire network for a platform is provided. A plurality of wires for the platform is sorted into a plurality of bundles based on a plurality of categories established for the plurality of wires with respect to operation of the platform. The plurality of categories includes an essential category. A primary layout output is generated for a primary bundle in the plurality of bundles corresponding to the essential category based on an available space within the platform. Forming and installing a primary wire harness corresponding to the primary bundle in the platform based on the primary layout output independently of a remaining portion of the plurality of bundles improves a build efficiency of the platform.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIGS. 11A and 11B are illustrations of a display of a portion of a layout output in accordance with an illustrative embodiment;

DETAILED DESCRIPTION

Figure 1:
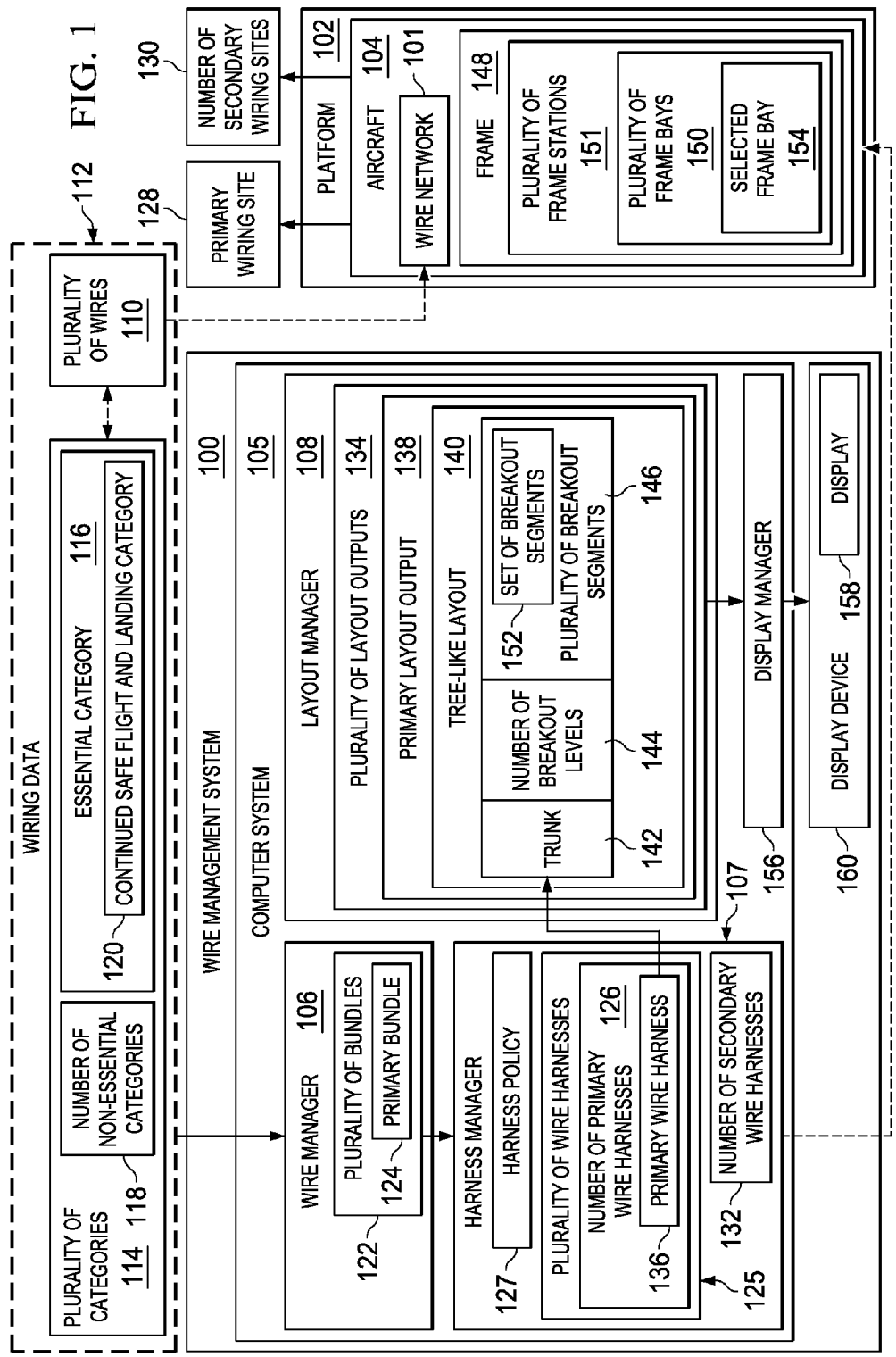
FIG. 1 is an illustration of a wire management environment in the form of a block diagram in accordance with an illustrative embodiment.

The illustrative embodiments recognize and take into account different considerations. For example, the illustrative embodiments recognize and take into account that it may be desirable to route wires that are essential to flight independently of wires that are not essential to flight in a platform, such as an aircraft. The wires essential to flight may be referred to as essential wires, while the wires that are not essential to flight may be referred to as non-essential wires.

In particular, the illustrative embodiments recognize and take into account that binding essential wires in wire harnesses independently of non-essential wires and then installing these wire harnesses prior to installing the non-essential wires may improve the usage of space within an aircraft. Further, installing essential wires in an aircraft independently of the non-essential wires may allow an aircraft to be certified for continued safe flight and landing at an earlier stage in the manufacturing of the aircraft.

The illustrative embodiments also recognize and take into account that some essential wires may require greater electrical protection than non-essential wires. For example, some essential wires may have stricter electrical separation requirements, stricter insulation requirements, stricter requirements of some other type, or some combination thereof as compared to some non-essential wires. Binding essential wires independently of non-essential wires may reduce the unnecessary overprotection of non-essential wires. Reducing the overprotection of non-essential wires may, in turn, reduce the expense associated with installing the non-essential wires and reduce the overall weight of the wire network established in the aircraft.

Additionally, the illustrative embodiments recognize and take into account that the layout to be used for and electrical requirements related to a wire harness may be the logical starting point for designing the electrical installation of the wire harness in an aircraft. It is desirable that the physical characteristics of the layout and the electrical requirements for a wire harness be determined with respect to the aircraft context as early as possible during the design and manufacturing process.

Determining this information earlier in the design and manufacturing process of the aircraft may allow the impact of the layout for the wire harness on the systems in the aircraft being supported by the wires in the wire harness to be considered and addressed. For example, determining the physical layout to be used for a wire harness during the design process and considering the impact of this type of layout on systems in the aircraft may allow changes to be made to the systems, the layout, or both to achieve a suitable balance.

Thus, the illustrative embodiments provide a method and apparatus for establishing a wire network for an aircraft that allows essential wires to be installed independently of non-essential wires. Further, the illustrative embodiments provide a method and apparatus for generating a layout file for each of any number of wire harnesses to be installed in the aircraft. The layout file for a particular wire harness may provide information regarding the layout for the wire harness with respect to a frame of the aircraft, the volume of space to be occupied by the wire harness, and the electrical separation requirements for the wire harness. The layout file may be visually presented in a manner that allows a human operator to quickly and easily identify and comprehend this information.

In one illustrative example, a plurality of wires for the aircraft are logically sorted into a plurality of bundles based on a plurality of categories established for the plurality of wires with respect to operation of the aircraft. The plurality of categories includes an essential category. The plurality of bundles includes a primary bundle that corresponds to this essential category. A primary layout file is generated for a primary wire harness corresponding to the primary bundle based on an available space within the aircraft. Installation of the primary wire harness in the aircraft independently of wires corresponding to a remaining portion of the plurality of bundles based on the primary layout file may improve a build efficiency of the aircraft.

Referring now to the figures and, in particular, with reference to FIG. 1, an illustration of a wire management environment is depicted in the form of a block diagram in accordance with an illustrative embodiment. In FIG. 1, wire management system 100 may be used to establish wire network 101 for platform 102.

Depending on the implementation, the platform 102 may take the form of any vehicle or system within which multiple wires may need to be installed. In this illustrative example, platform 102 takes the form of aircraft 104.

The wire management system 100 may be implemented using hardware, firmware, software, or a combination thereof. In one illustrative example, wire management system 100 is implemented using computer system 105. Computer system 105 may include a single computer or multiple computers in communication with each other.

As depicted, the wire management system 100 may include a wire manager 106, a harness manager 107, and a layout manager 108. Each of wire manager 106, harness manager 107, and layout manager 108 may be implemented using hardware, firmware, software, or a combination thereof. For example, each of wire manager 106, harness manager 107, and layout manager 108 may be implemented using a processor unit. In another example, wire manager 106, harness manager 107, and layout manager 108 may be implemented within the same processor unit. In other examples, wire manager 106, harness manager 107, and layout manager 108 may be implemented using a single computer or multiple computers in communication with each other.

The plurality of wires 110 includes all wires that will be used in the aircraft 104. As used herein, a "wire" may be an electrical wire or a non-electrical wire. In other illustrative examples, a wire may be referred to as a line, a cable, or a cord.

The wire manager 106 may receive wiring data 112. Wiring data 112 may be received in the form of, for example, without limitation, one or more data files. Wiring data 112 may identify plurality of wires 110 and plurality of categories 114 for plurality of wires 110. In one illustrative example, plurality of categories 114 corresponds to a plurality of levels of relative importance of the wires to the operation of platform 102.

When the platform 102 takes the form of an aircraft 104, the operation of the aircraft 104 may include the functions of the aircraft 104 related to flight and any functions related to the one or more missions designated for the aircraft 104. For example, aircraft 104 may be designated for performing cargo transport, passenger transport, surveillance, weapon deployment, some other type of mission, or some combination thereof.

As depicted, the plurality of categories 114 includes an essential category 116 and a number of non-essential categories 118 with respect to operation of platform 102. As used herein, a "number of" items may include one or more items. In this manner, number of non-essential categories 118 may include one or more non-essential categories.

Any wires in plurality of wires 110 that correspond to essential category 116 may be essential to the operation of platform 102 and may be thus referred to as essential wires. In some cases, essential category 116 may be referred to as a critical category. Any wires in plurality of wires 110 that correspond to number of non-essential categories 118 may not be essential to the operation of platform 102 and may be referred to as non-essential wires. In some cases, the number of non-essential categories 118 may be referred to as a number of non-critical categories.

The essential category 116 in the context of the aircraft 104 may be also referred to as a flight-essential category. This flight-essential category may be, for example, continued safe flight and landing category 120. A set of wires in plurality of wires 110 corresponding to continued safe flight and landing category 120 may be substantially all wires required to ensure the continued safe flight and landing of aircraft 104 when aircraft 104 is in service. Examples of non-essential categories are described in FIG. 2 below.

The wire manager 106 sorts the plurality of wires 110 into a plurality of bundles 122 based on the plurality of categories 114 established for the plurality of wires 110 with respect to operation of the aircraft 104. A "bundle," as used herein, may be the collection of substantially all wires in the plurality of wires 110 corresponding to a particular one category of the plurality of categories 114.

Sorting the plurality of wires 110 into the plurality of bundles 122 means identifying which of the plurality of wires 110 belong to which of the plurality of bundles 122 based on the plurality of categories 114. In one illustrative example, this identification may be performed based on wiring data 112 received by wire manager 106. In some cases, wiring data 112 may include data that identifies which of plurality of wires 110 belong to which of plurality of bundles 122.

In these illustrative examples, a bundle may be identified for each one of plurality of categories 114. For example, the plurality of bundles 122 includes primary bundle 124 corresponding to essential category 116. Further, the plurality of bundles 122 may include a number of secondary bundles corresponding to the number of non-essential categories 118.

The harness manager 107 is configured to determine a number of wire harnesses to be formed for each bundle in the plurality of bundles 122. Each of these wire harnesses may be an assembly of multiple wires from plurality of wires 110 that are bound together using, for example, without limitation, straps, wire ties, wire lacing, sleeves, electrical tape, string, some other type of binding element, or some combination thereof.

For example, the harness manager 107 may identify the plurality of wire harnesses 125 that are to be assembled and installed in the aircraft 104. Each of plurality of wire harnesses 125 may include at least one wire in the plurality of wires 110. One or more wire harnesses in plurality of wire harnesses 125 may correspond to each bundle in the plurality of bundles 122 and thereby, to each category in plurality of categories 114. In other words, each wire harness in plurality of wire harnesses 125 may correspond to a particular bundle in plurality of bundles 122 and thereby, a particular category in plurality of categories 114.

In some illustrative examples, the harness manager 107 may use a harness policy 127 to identify the plurality of wire harnesses 125 that are to be assembled using the plurality of wires 110. Harness policy 127 may include any number of requirements, harness specifications, electrical requirements, other type of information, or some combination thereof needed for identifying plurality of wire harnesses 125.

The plurality of wire harnesses 125 to be formed and installed in the aircraft 104 includes a number of primary wire harnesses 126 and a number of secondary wire harnesses 132. As depicted, harness manager 107 may determine how many primary wire harnesses 126 need to be formed for primary bundle 124. In this manner, number of primary wire harnesses 126 corresponds to primary bundle 124. In some cases, harness manager 107 may determine how many secondary wire harnesses 132 need to be formed for each of a number of secondary bundles in plurality of bundles 122. In this manner, number of secondary wire harnesses 132 may correspond to a number of secondary bundles in plurality of bundles 122. This number of secondary bundles may correspond to number of non-essential categories 118.

Consequently, in this illustrative example, each of the number of primary wire harnesses 126 contains wires from plurality of wires 110 that correspond to essential category 116. Each of the number of secondary wire harnesses 132 contains wires from plurality of wires 110 that correspond to number of non-essential categories 118.

The number of primary wire harnesses 126 allows the wires identified in the plurality of wires 110 corresponding to the essential category 116 to be readily distinguishable from other wires corresponding to the number of non-essential categories 118. Further, number of primary wire harnesses 126 may keep the wires corresponding to essential category 116 separated from the wires corresponding to number of non-essential categories 118.

The number of primary wire harnesses 126 may be installed in the aircraft 104 independently of any other wire harnesses corresponding to the number of non-essential categories 118. In one illustrative example, number of primary wire harnesses 126 may be installed in aircraft 104 prior to any other wire harnesses. For example, number of primary wire harnesses 126 may be installed in aircraft 104 at primary wiring site 128. As used herein, a wiring site, such as primary wiring site 128, may be a facility, a factory, an area in a factory, or some other type of wire installation site.

An aircraft 104 having only the number of primary wire harnesses 126 installed in the aircraft 104 may be made ready for certification of the aircraft 104 with respect to continued safe flight and landing requirements for the aircraft 104. In other words, aircraft 104 may be certified for continued safe flight and landing having number of primary wire harnesses 126 installed but no other wire harnesses corresponding to number of non-essential categories 118. Being able to perform this certification earlier in the manufacturing process for aircraft 104 may allow aircraft 104 having only number of primary wire harnesses 126 to be moved to number of secondary wiring sites 130 for the formation and installation of number of secondary wire harnesses 132 corresponding to number of non-essential categories 118.

As one illustrative example, the primary wiring site 128 may be a facility belonging to the manufacturer of aircraft 104. Once aircraft 104 having only the number of primary wire harnesses 126 installed is certified, aircraft 104 may be moved to any one of number of secondary wiring sites 130. A factory belonging to a commercial airline may be an example of one of number of secondary wiring sites 130. Aircraft 104 may be sent to this factory such that number of secondary wire harnesses 132 corresponding to missions specific for the commercial airline may be formed and installed in aircraft 104.

In other illustrative examples, one or more of the number of secondary wire harnesses 132 may be installed at a primary wiring site 128. Any remaining uninstalled secondary wire harnesses may then be installed at number of secondary wiring sites 130.

A layout manager 108 generates the plurality of layout outputs 134 for the plurality of wire harnesses 125. The installation of each wire harness in plurality of harnesses 125 may be performed based on a corresponding layout output in plurality of layout outputs 134. Each of plurality of layout outputs 134 provides information about the layout to be used for the corresponding wire harness in the installation context for aircraft 104, the volume of space to be occupied by the corresponding wire harness, and any separation requirements for the corresponding wire harness.

Each of the plurality of layout outputs 134 may be, for example, without limitation, a layout file that identifies an installation layout for a corresponding one of the plurality of harnesses 125. The layout file may take the form of, for example, but not limited to, a spreadsheet, an image, a database, or some other type of computer file.

The primary wire harness 136 may be an example of one of the number of primary wire harnesses 126. Primary wire harness 136 is an assembly of a corresponding number of essential wires in plurality of wires 110 that correspond to essential category 116. Layout manager 108 generates primary layout output 138 for primary wire harness 136.

In particular, the primary layout output 138 may identify a tree-like layout 140 for the primary wire harness 136. Tree-like layout 140 includes trunk 142, number of breakout levels 144, and plurality of breakout segments 146. Plurality of breakout segments 146 break away from trunk 142 at number of breakout levels 144.

For example, the trunk 142 may include at least a portion of the length of every wire that is to be bound within the primary wire harness 136. Trunk 142 may be configured to run substantially parallel to, along, offset from, or at an angle relative to a longitudinal axis through aircraft 104. This longitudinal axis may be the center axis of aircraft 104 that runs in the forward-aft direction.

One or more breakout segments of the plurality of breakout segments 146 may break away from the trunk 142 at a first breakout level in the number of breakout levels 144. In some cases, one or more other breakout segments of plurality of breakout segments 146 may then break away from one or more of these first breakout segments at a second breakout level in number of breakout levels 144. In this manner, plurality of breakout segments 146 may break away from trunk 142 in a manner similar to the manner in which branches split off from the trunk of a tree.

As depicted, the aircraft 104 may have a frame 148 that forms a plurality of frame bays 150. In particular, frame 148 may be comprised of plurality of frame stations 151 that form plurality of frame bays 150. In other illustrative examples, these frame stations may be referred to as frame sections, frame segments, frame members, or frame elements.

Each frame bay in plurality of frame bays 150 may be the area between two frame stations. Primary layout output 138 may provide information about tree-like layout 140 for primary wire harness 136 in the context of plurality of frame bays 150 and plurality of frame stations 151.

For example, in generating the tree-like layout 140, the layout manager 108 may designate a set of breakout segments in the plurality of breakout segments 146 to break away from the trunk 142 at a first breakout level within each of the plurality of frame bays 150. As used herein, a "set of" items may include zero or more items. For example, the set of items may include zero items, one item, two items, five items, or some other number of items. When the set of items includes zero items, the set of items may be referred to as an empty set. In this manner, zero, one, or more breakout segments may be designated to break away from trunk 142 within each of plurality of frame bays 150.

In one illustrative example, the layout manager 108 may designate the set of breakout segments 152 to break away from the trunk 142 within the selected frame bay 154. In this manner, layout manager 108 may assign set of breakout segments 152 to selected frame bay 154. When a set of breakout segments, such as set of breakout segments 152, is assigned to a frame bay, such as selected frame bay 154, the set of breakout segments may be selected to break away from the trunk 142 at some location within the assigned frame bay.

The primary layout output 138 may also provide information about the volume of space to be occupied by the primary wire harness 136. For example, primary layout output 138 may include a diameter for trunk 142 and a diameter for each of plurality of breakout segments 146. In some cases, the diameter for trunk 142 may change along a length of trunk 142. The diameter of a breakout segment in plurality of breakout segments 146 may remain substantially constant.

Additionally, the primary layout output 138 may provide information about the separation requirements for the primary wire harness 136. For example, not all of the corresponding number of essential wires in primary wire harness 136 may have the same electrical separation requirements.

A separation requirement for a particular wire of a particular type may indicate from which other types of wires the particular wire may need to be isolated. In some cases, the separation requirement may include a minimum distance required between the particular wire of the particular type and wires of other types. When this separation is needed to reduce a possibility of an undesired electrical event occurring with the particular wire affecting other wires, the separation requirement may be referred to as an electrical separation requirement.

As wires run into and out of the trunk 142, the strictest separation requirement for the primary wire harness 136 may change along the trunk 142. Further, the strictest separation requirement for individual breakout segments in plurality of breakout segments 146 may be the same or different.

The primary layout output 138 may indicate the strictest separation requirement for different portions of the trunk 142 and for the different breakout segments in the plurality of breakout segments 146. In this manner, the entire primary wire harness 136 may not need to be treated as having the separation requirement of the wire in primary wire harness 136 having the strictest separation requirement.

In some illustrative examples, the wire management system 100 may include a display manager 156. Similar to wire manager 106, harness manager 107, and layout manager 108, display manager 156 may be implemented using hardware, firmware, software, or some combination thereof. In other illustrative examples, display manager 156 may be implemented separately from wire management system 100.

As depicted, the display manager 156 may receive the plurality of layout outputs 134. Display manager 156 is configured to visually present each of plurality of layout outputs 134 to a human operator. As one illustrative example, display manager 156 may generate display 158 for primary layout output 138. Display 158 may be visually presented using display device 160.

The display 158 may provide a visual representation of the tree-like layout 140 in the primary layout output 138. In particular, display 158 may provide a visual representation that allows a human operator to visualize the volume of space needed within aircraft 104 for primary wire harness 136 and the separation requirements needed for different portions of primary wire harness 136 relative to an installation context for aircraft 104. In other words, display 148 allows a visualization of a volume of space needed within aircraft 104 for primary wire harness 136 and separation requirements for a corresponding number of essential wires within primary wire harness 136 relative to an installation context for aircraft 104.

For example, the display 158 may be generated such that the different portions of the tree-like layout 140 in the display 158 having different separation requirements are color-coded with colors corresponding to the different separation requirements. In this manner, display 158 may provide a visual representation of the separation requirements for the different portions of tree-like layout 140 that may be quickly and easily understood.

Thus, the plurality of layout outputs 134 may be used to install the plurality of wires 110 in the platform 102. Plurality of wires 110 installed in plurality of wire harnesses 125 according to plurality of layout outputs 134 may form wire network 101. In other illustrative examples, wire network 101 may be formed just by the installation of number of primary wire harnesses 126 according to the number of corresponding layout outputs generated for number of primary wire harnesses 126.

Using the plurality of categories 114 to determine the plurality of bundles 122 and subsequently, the plurality of wire harnesses 125, and then generating the plurality of layout outputs 134 for the plurality of wire harnesses 125 may improve the build efficiency of the platform 102. In particular, forming and installing the primary wire harness 136 corresponding to the primary bundle 124 in aircraft 104 based on the primary layout output 138 independently of a remaining portion of the plurality of bundles 122 improves a build efficiency of the aircraft 104.

In some cases, the plurality of layout outputs 134 generated by the layout manager 108 may include a number of secondary layout outputs for the number of secondary wire harnesses 132 corresponding to the number of secondary bundles in the plurality of bundles 122. Forming and installing the number of secondary wire harnesses 132 based on the number of secondary layout outputs generated by the layout manager 108 may improve the build efficiency of aircraft 104.

Figure 2:
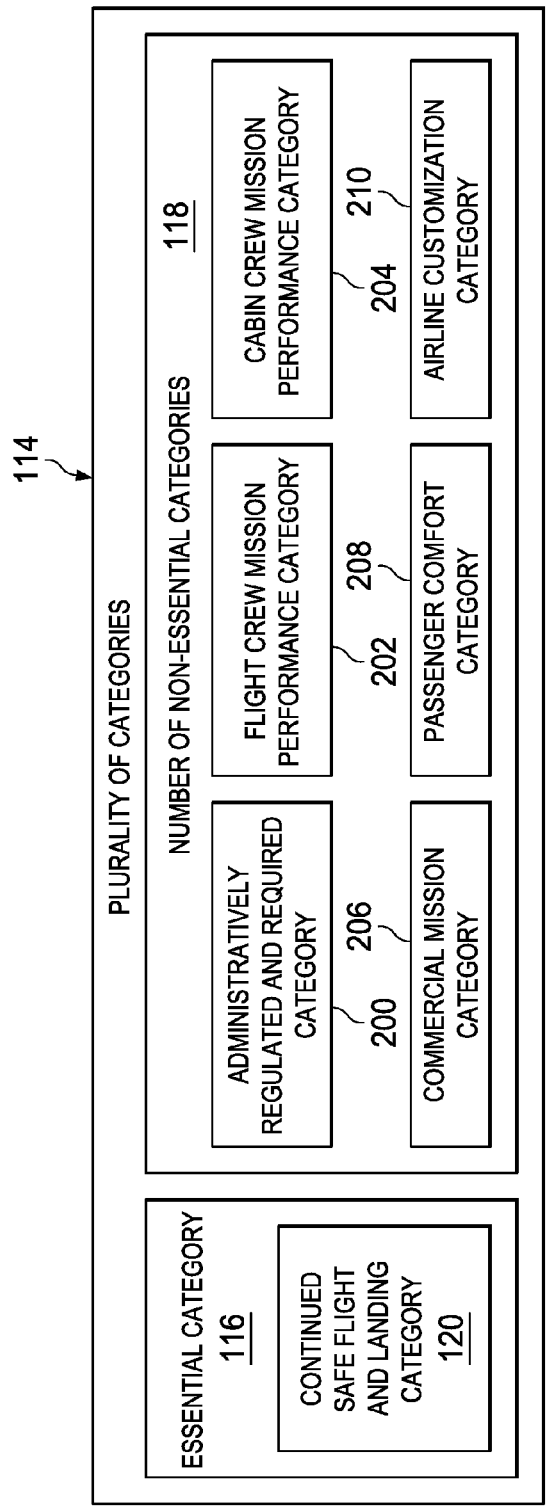
FIG. 2 is an illustration of a plurality of categories in the form of a block diagram in accordance with an illustrative embodiment.

With reference now to FIG. 2, an illustration of the plurality of categories 114 from FIG. 1 is depicted in the form of a block diagram in accordance with an illustrative embodiment. As depicted, plurality of categories 114 includes essential category 116 and number of non-essential categories 118.

When the platform 102 takes the form of the aircraft 104 as described in FIG. 1, the essential category 116 may be the continued safe flight and landing category 120. Further, number of non-essential categories 118 may include at least one of administratively regulated and required category 200, flight crew mission performance category 202, cabin crew mission performance category 204, commercial mission category 206, passenger comfort category 208, and airline customization category 210.

As used herein, the phrase "at least one of," when used with a list of items, means different combinations of one or more of the listed items may be used and only one of the items in the list may be needed. The item may be a particular object, thing, action, process, or category. In other words, "at least one of" means any combination of items or number of items may be used from the list, but not all of the items in the list may be required.

Wires corresponding to the administratively regulated and required category 200 include any wires in plurality of wires 110 in FIG. 1 that are administratively regulated, administratively required, or both. These wires may include, for example, without limitation, wires that are regulated by the United States government, the Federal Aviation Administration (FAA), some other type of administration, or some combination thereof.

Wires corresponding to the flight crew mission performance category 202 include any wires in the plurality of wires 110 in FIG. 1 that are used to perform a flight crew mission for the aircraft 104 in FIG. 1. These wires may include, for example, without limitation, any wires that are used by electrical systems and other types of systems in aircraft 104 that allow the flight crew to perform their tasks before, during, and after flight. The flight crew may include the pilot and the co-pilot.

Further, wires corresponding to the cabin crew mission performance category 204 include any wires in the plurality of wires 110 in FIG. 1 that are used to perform a cabin crew mission for the aircraft 104 in FIG. 1. These wires may include, for example, without limitation, any wires that are used by electrical systems and other types of systems in the cabin that allow the cabin crew to perform their tasks before, during, and after flight. The cabin crew may include any number of flight attendants, a loadmaster, a cabin crew manager, or some combination thereof.

The commercial mission category 206 may be the category for wires that are related to the commercial mission for the aircraft 104 when the aircraft 104 is used commercially. The commercial mission may include, for example, without limitation, passenger transport, cargo transport, medical supply transport, or some combination thereof.

Wires corresponding to the passenger comfort category 208 include any wires that are related to maintaining passenger comfort before, during, and after flight. These wires may include, for example, without limitation, wires that are related to a lighting system within the cabin of aircraft 104, wires related to an entertainment system, wires related to a phone system, and other types of wires.

Wires corresponding to the airline customization category 210 include any wires that are related to systems specific to an airline that will be using the aircraft 104. These wires may include, for example, without limitation, wires related to passenger comfort, wires related to an entertainment system specific to the airline, wires related to a food refrigeration system specific to the airline, and other types of wires.

The illustrations of the wire management system 100 and the platform 102 in FIG. 1 and plurality of categories 114 in FIG. 2 are not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

For example, although the wire manager 106 and the harness manager 107 are depicted separately in FIG. 1, the harness manager 107 may be considered part of the wire manager 106 in other implementations. In some illustrative examples, wire manager 106 may be configured to perform the operations performed by harness manager 107.

In other illustrative examples, the platform 102 may take some form other than the aircraft 104. For example, platform 102 may take the form of a spacecraft, such as a shuttle. As another example, platform 102 may take the form of an unmanned aerial vehicle (UAV). As yet another example, platform 102 may take the form of a missile.

Figure 3:
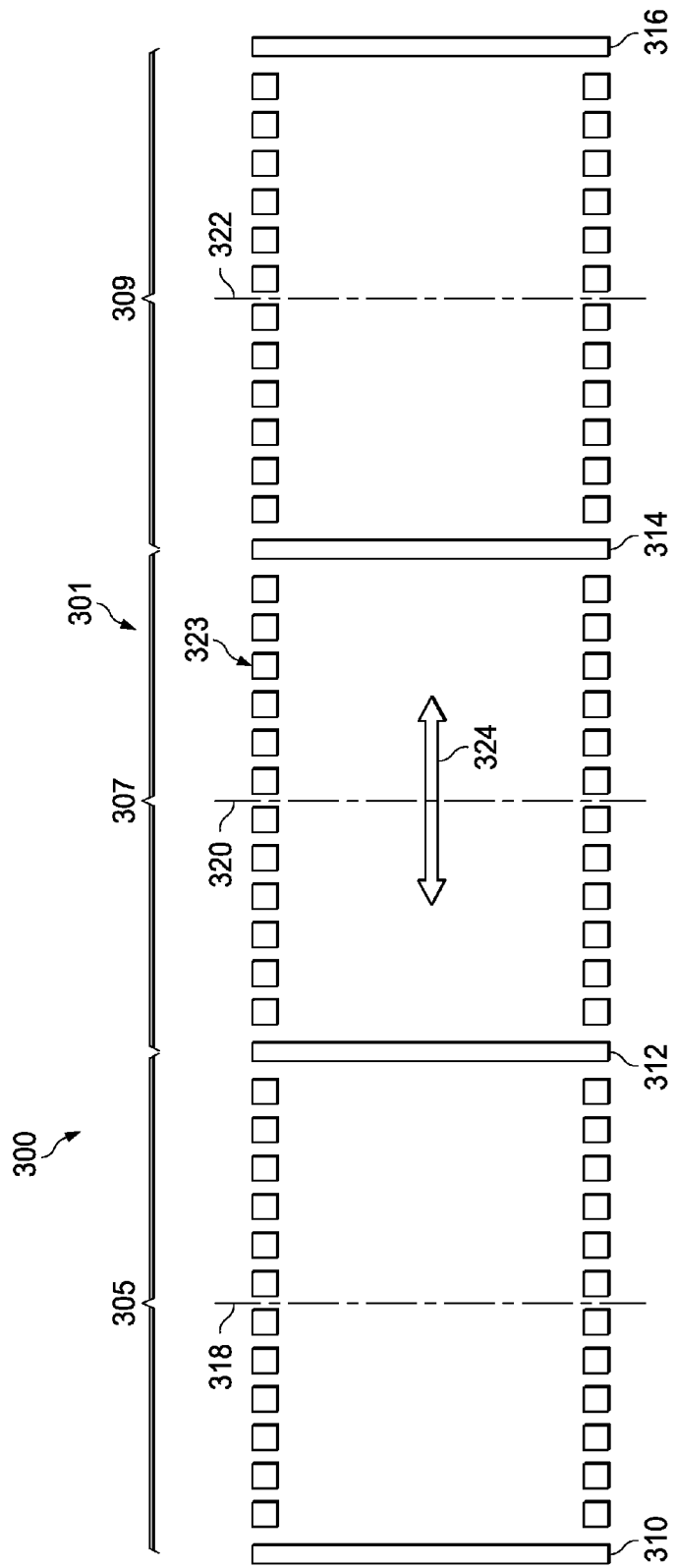
FIG. 3 is an illustration of the identification of a vector for a trunk of a wire harness comprising bundled wires in accordance with an illustrative embodiment.

With reference now to FIG. 3, an illustration of the identification of a vector for a trunk of a wire harness comprising bundled wires is depicted in accordance with an illustrative embodiment. In this illustrative example, fuselage portion 300 of an aircraft is depicted. A plurality of frame bays 301 is depicted within fuselage portion 300.

The plurality of frame bays 301 includes frame bay 305, frame bay 307, and frame bay 309. As depicted, frame bay 305 is formed by frame station 310 and frame station 312. Frame bay 307 is formed by frame station 312 and frame station 314. Frame bay 309 is formed by frame station 314 and frame station 316. Frame bay 305, frame bay 307, and frame bay 309 have centerline 318, centerline 320, and centerline 322, respectively.

As depicted, a plurality of devices 323 may be present within the fuselage portion 300. This plurality of devices 323 may be the devices to which wires are to connect. Prior to the generation of an initial layout for a wire harness that will hold these wires and span plurality of frame bays 301, vector 324 may need to be identified. Vector 324 may be for the trunk of a wire harness to be formed bundling the wires that will connect to plurality of devices 323. First, the locations of plurality of devices 323 within the aircraft are identified with respect to a coordinate system for the aircraft. The locations of plurality of devices 323 may then be used to generate vector 324.

The vector 324 may be the centerline, or mean vector, for the locations of plurality of devices 323. Vector 324 may or may not be substantially parallel to a longitudinal axis of the aircraft.

The vector 324 is then evaluated. The direction of the vector 324 may determine the axis along which a trunk of the initial layout for the wire harness will lie. For example, if vector 324 runs in a substantially lateral direction with respect to the aircraft, the trunk may be designated to run substantially along a lateral axis of the aircraft. If vector 324 runs in a substantially vertical direction with respect to the aircraft, the trunk may be designated to run substantially along a vertical axis of the aircraft. If vector 324 runs in a substantially longitudinal direction with respect to the aircraft, the trunk may be designated to run substantially along a longitudinal axis of the aircraft.

Figure 4:
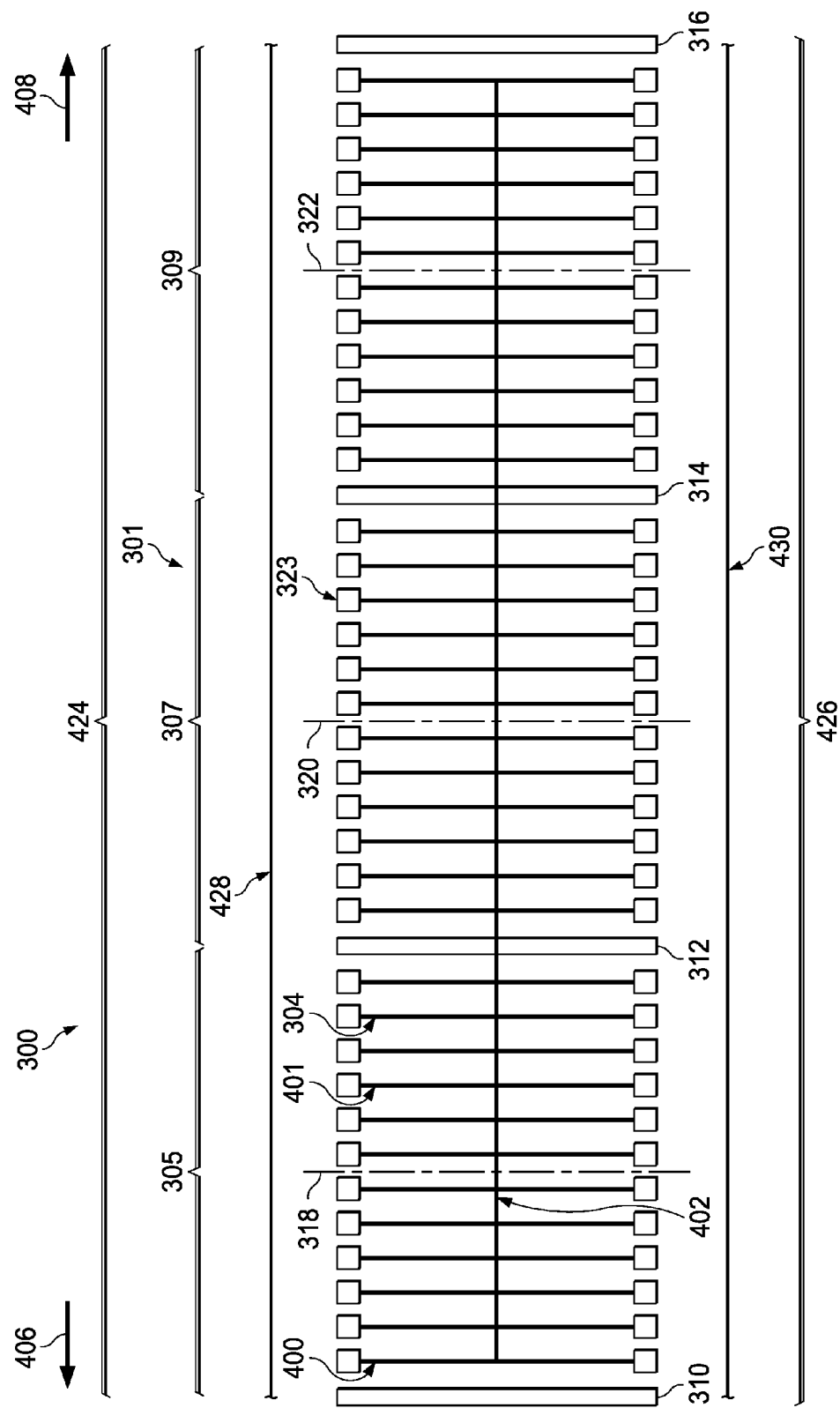
FIG. 4 is an illustration of an initial layout for wires within frame bays for an aircraft in accordance with an illustrative embodiment.

With reference now to FIG. 4, an illustration of an initial layout for wires within frame bays for an aircraft is depicted in accordance with an illustrative embodiment. In FIG. 4, initial layout 400 for wire harness 401 is depicted. Initial layout 400 is depicted within the context of a frame for fuselage portion 300 in FIG. 3. Only the portion of initial layout 400 corresponding to frame bay 305, frame bay 307, and frame bay 309 is shown in this illustrative example. Initial layout 400 may be a starting point for a layout manager, such as layout manager 108 in FIG. 1, to generate a final tree-like layout, similar to tree-like layout 140 in FIG. 1, for wire harness 401.

Wire harness 401 may be an example of one implementation for one of plurality of wire harnesses 125 in FIG. 1 identified by harness manager 107 in FIG. 1. All of the wires included within wire harness 401 may belong to a same bundle and thereby, correspond to a same category. This category may be, for example, one of plurality of categories 114 in FIG. 2.

In this illustrative example, initial layout 400 includes trunk 402 and plurality of segments 404. As depicted, trunk 402 is laid out such that trunk 402 lies substantially along vector 324 identified in FIG. 3. Trunk 402 continues in forward direction 406 with respect to the aircraft and in aft direction 408 with respect to the aircraft. In particular, trunk 402 may span a plurality of frame bays within a fuselage of the aircraft.

In this illustrative example, each of plurality of segments 404 breaks away from trunk 402. Each of plurality of segments 404 may include one or more wires that connect to a corresponding one of plurality of devices 323. Plurality of devices 323 includes first portion 424 located at or near side 428 of fuselage portion 300 and second portion 426 located at or near side 430 of fuselage portion 300.

A device in plurality of devices 323 may take the form of, for example, without limitation, a piece of equipment, a computer, a controller, an electrical device, or some other type of device. In some cases, the device may be an electromechanical device.

The portion of plurality of segments 404 located within frame bay 305 may be reconfigured such that the number of segments that directly break away from trunk 402 is reduced. The portion of plurality of segments 404 in frame bay 307 and the portion of plurality of segments 404 in frame bay 309 may be reconfigured in a similar manner. An example of the process by which the portion of plurality of segments 404 in frame bay 305 and the portion of plurality of segments 404 in frame bay 307 may be reconfigured is described in FIGS. 5-9 below.

Figure 5:
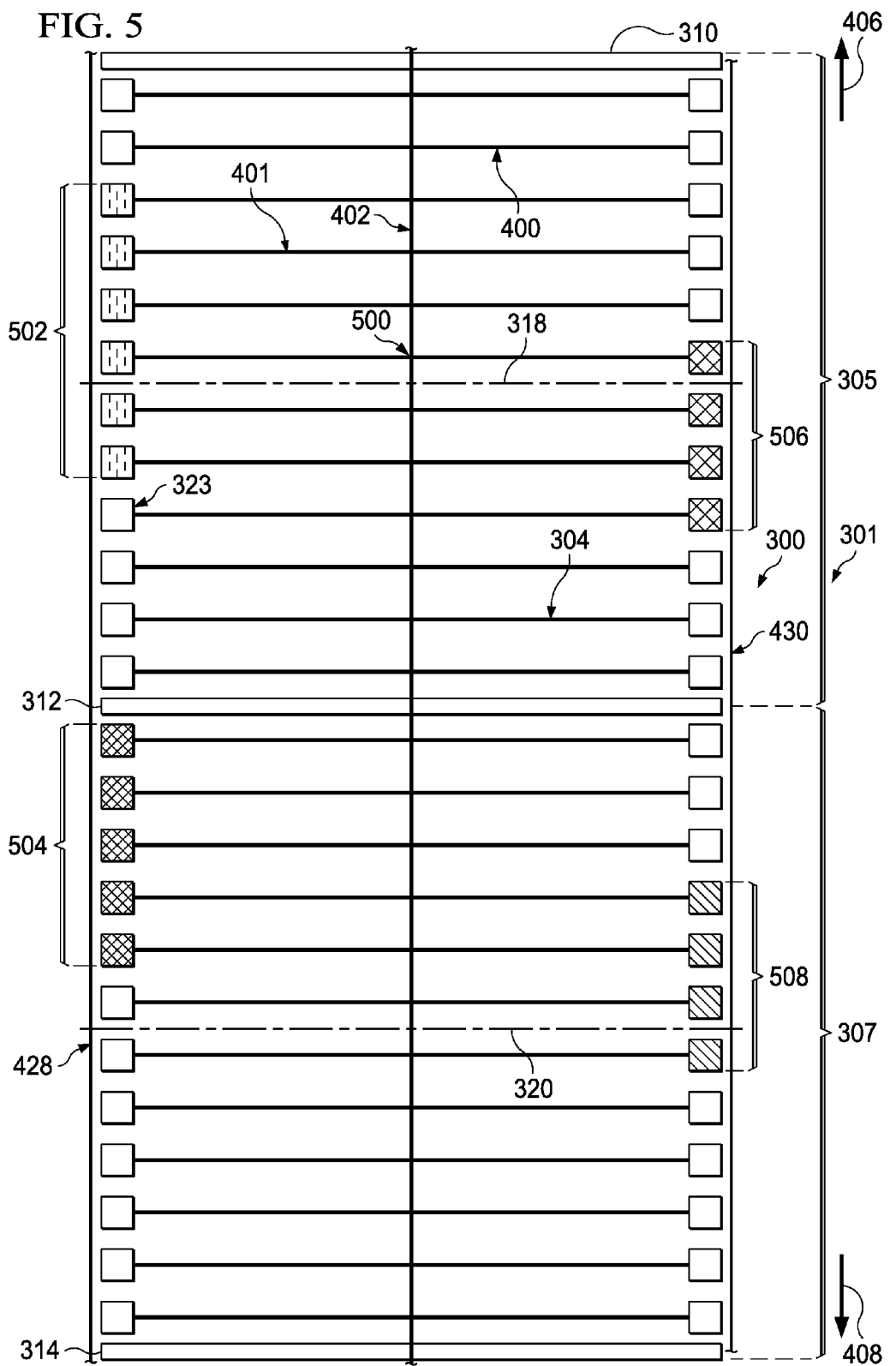
FIG. 5 is an illustration of a grouping of devices in accordance with an illustrative embodiment.

With reference now to FIG. 5, an illustration of a grouping of devices is depicted in accordance with an illustrative embodiment. In this illustrative example, all segments in plurality of segments 404 break away from trunk 402 at first breakout level 500.

Any devices in plurality of devices 323 that are connected to a same end device may be logically grouped to reduce the number of breakout segments within first breakout level 500. The end device may take the form of, for example, without limitation, a line replaceable unit (LRU), a disconnect panel, or some other type of end device.

As depicted, the devices in group of devices 502 have been identified as connecting to a same end device. Similarly, the devices in group of devices 504 have been identified as connecting to a same end device. Further, the devices in group of devices 506 have been identified as connecting to a same end device. The devices in group of devices 508 have been identified as connecting to a same end device.

The different segments containing wires that connect to group of devices 502, group of devices 504, group of devices 506, and group of devices 508 may be grouped, respectively. An example of this grouping of the segments is depicted in FIG. 6 below.

Figure 6:
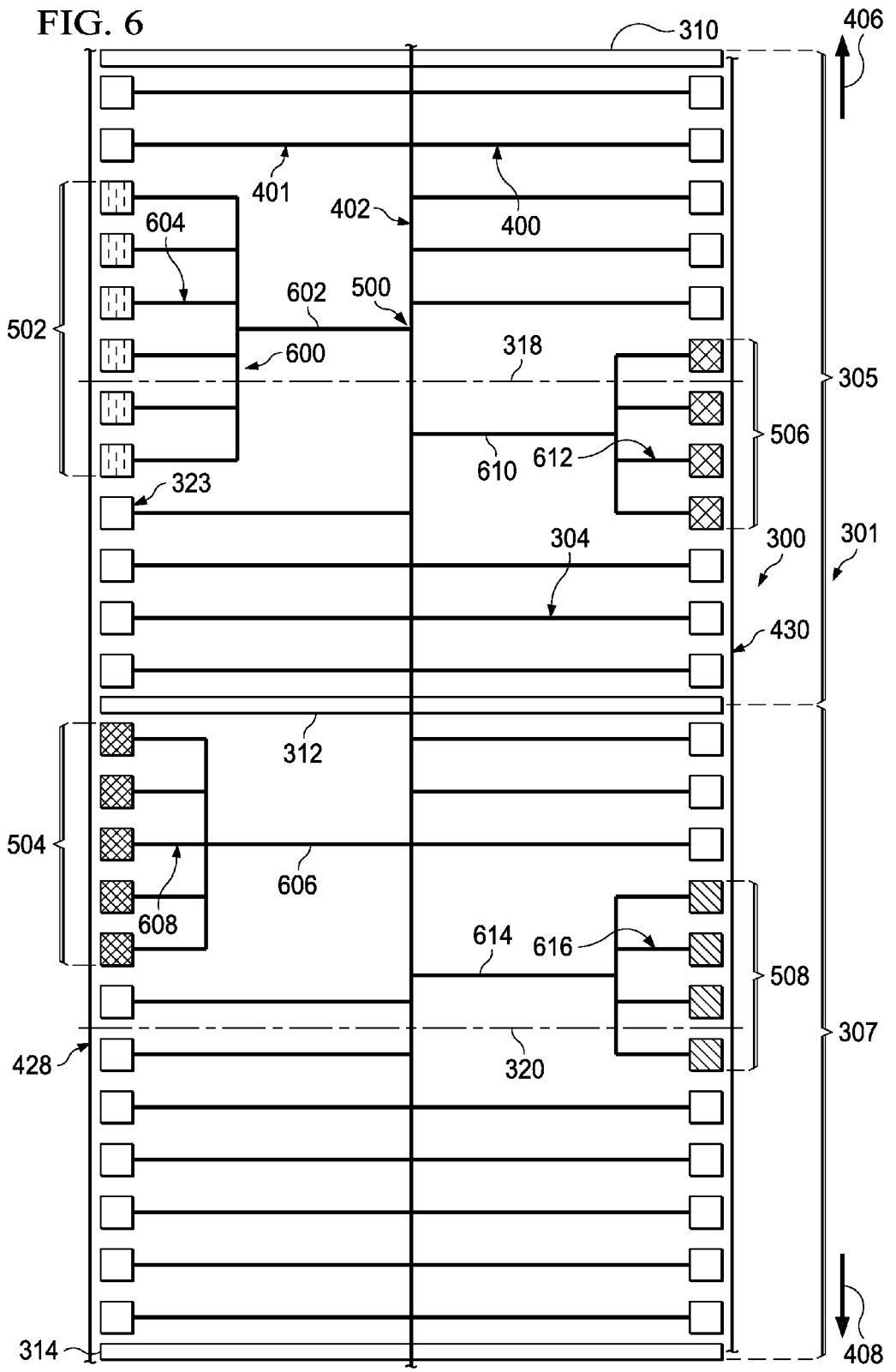
FIG. 6 is an illustration of a grouping of segments in accordance with an illustrative embodiment.

With reference now to FIG. 6, an illustration of a grouping of segments is depicted in accordance with an illustrative embodiment. In this illustrative example, grouping segments to reduce the number of segments that directly break away from trunk 402 at first breakout level 500 may result in second breakout level 600 being created.

For example, the six segments that connected to group of devices 502 in FIG. 5 have been grouped to form breakout segment 602. An end portion of each of these six segments may then break away from breakout segment 602 at second breakout level 600 to form group of breakout segments 604 that connect to group of devices 502.

Similarly, the five segments that connected to group of devices 504 in FIG. 5 have been grouped to form breakout segment 606. An end portion of each of these five segments may then break away from breakout segment 606 at second breakout level 600 to form group of breakout segments 608 that connect to group of devices 504.

Further, the four segments that connected to group of devices 506 in FIG. 5 have been grouped to form breakout segment 610. An end portion of each of these four segments may then break away from breakout segment 610 at second breakout level 600 to form group of breakout segments 612 that connect to group of devices 506.

Lastly, the four segments that connected to group of devices 508 in FIG. 5 have been grouped to form breakout segment 614. An end portion of each of these four segments may then break away from breakout segment 614 at second breakout level 600 to form group of breakout segments 616 that connect to group of devices 504.

Figure 7:
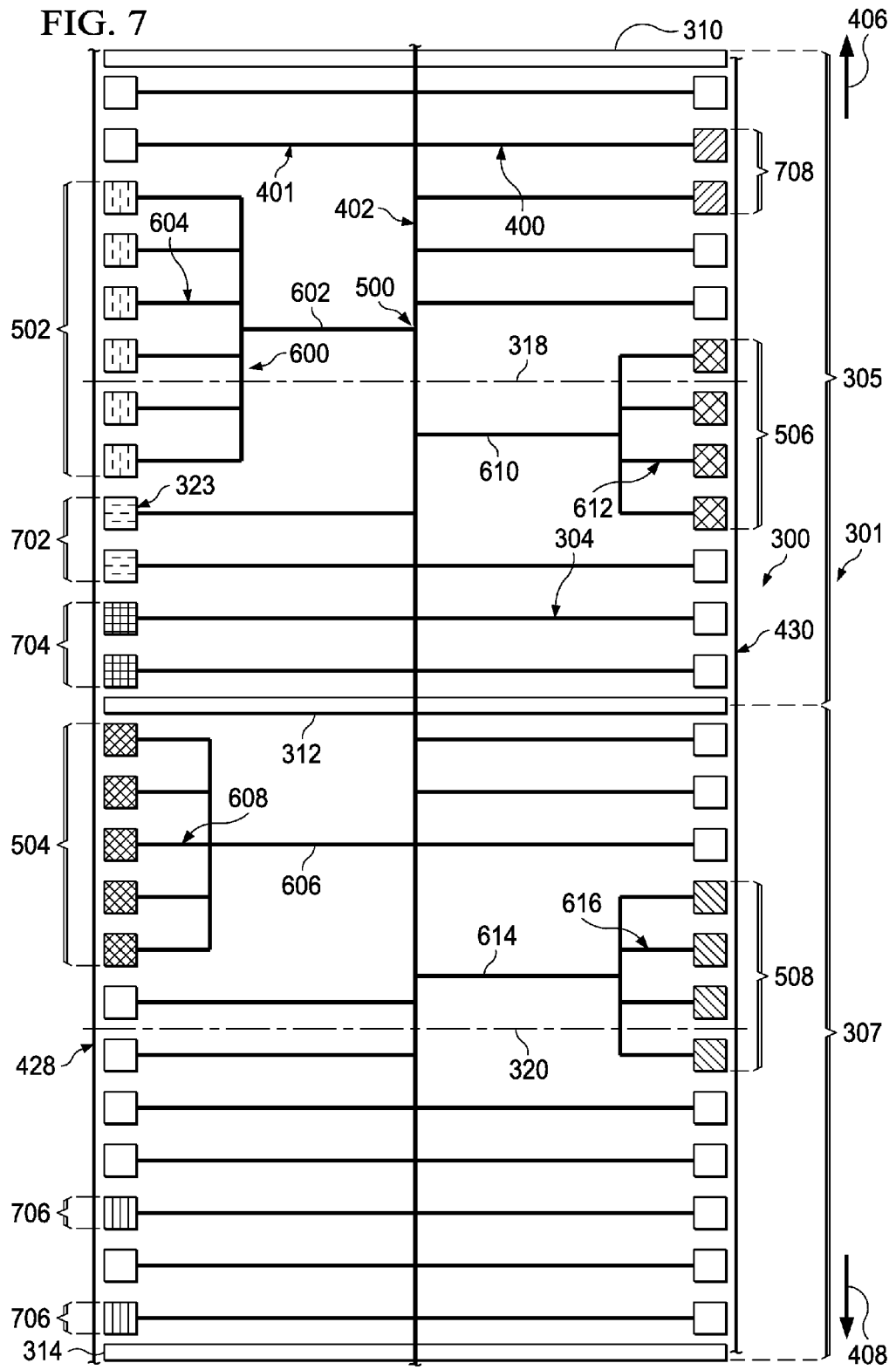
FIG. 7 is an illustration of the identification of associated devices in accordance with an illustrative embodiment.

With reference now to FIG. 7, an illustration of the identification of associated devices is depicted in accordance with an illustrative embodiment. In this illustrative example, any devices that are associated with each other are logically grouped.

As depicted, group of devices 702, group of devices 704, group of devices 706, and group of devices 708 are identified. Each of these groups of devices includes devices that are associated with each other. These devices in a particular group of devices may be associated with each of other by, for example, without limitation, being associated with a same grounding point. Of course, some other type of association may be possible. The segments connecting to the devices in each group of devices may be grouped. An example of this grouping is depicted in FIG. 8 below.

Figure 8:
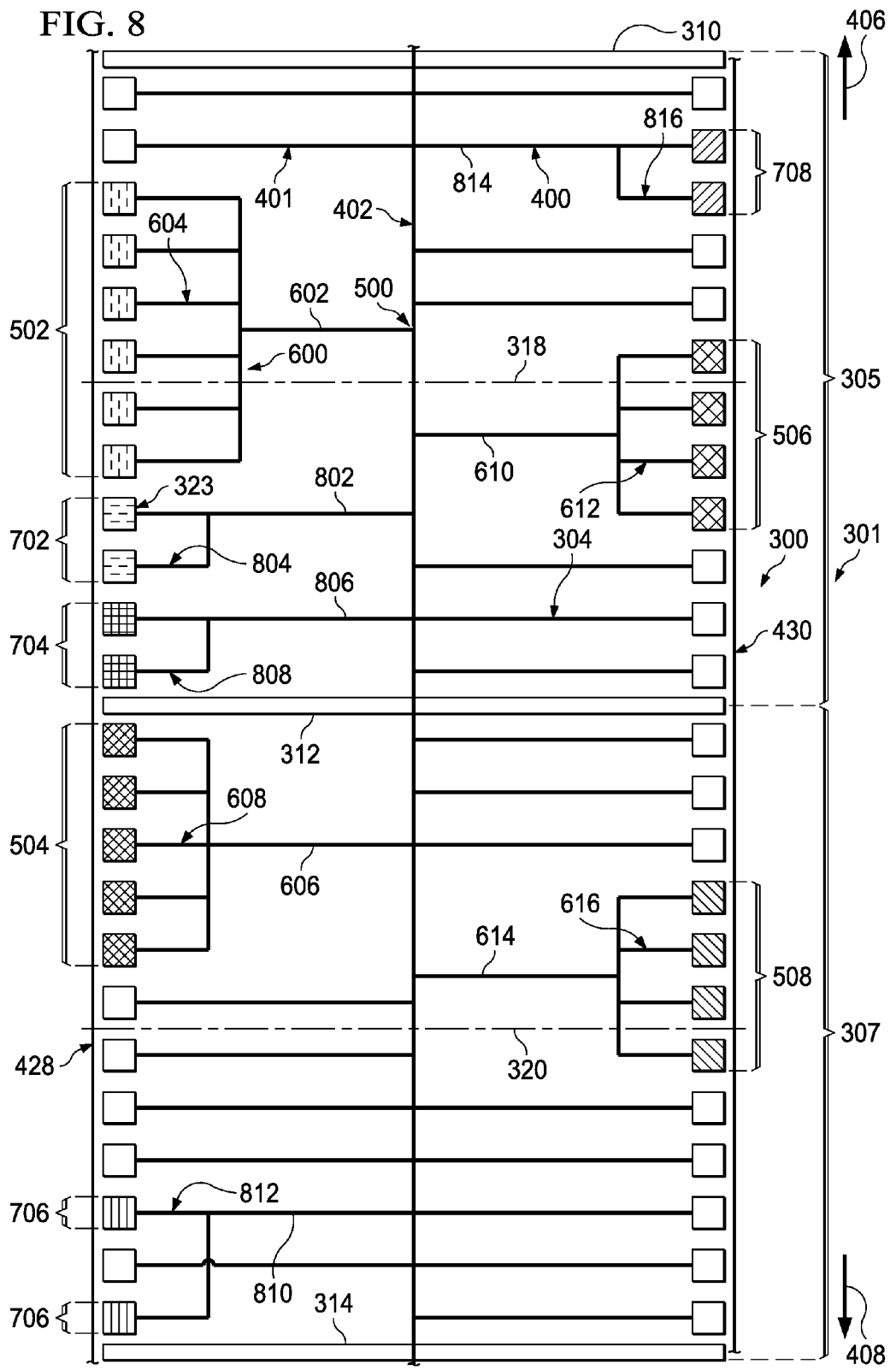
FIG. 8 is an illustration of another grouping of segments in accordance with an illustrative embodiment.

With reference now to FIG. 8, an illustration of another grouping of segments is depicted in accordance with an illustrative embodiment. In this illustrative example, the segments connecting to the devices in each of group of devices 702, group of devices 704, group of devices 706, and group of devices 708 are grouped to reduce the number of segments that directly break away from trunk 402 at first breakout level 500.

As depicted, the two segments that connected to group of devices 702 in FIG. 7 have been grouped to form breakout segment 802. An end portion of each of these two segments may then break away from breakout segment 802 at second breakout level 600 to form group of breakout segments 804 that connect to group of devices 702.

Similarly, the two segments that connected to group of devices 704 in FIG. 7 have been grouped to form breakout segment 806. An end portion of each of these two segments may then break away from breakout segment 806 at second breakout level 600 to form group of breakout segments 808 that connect to group of devices 704.

Further, the two segments that connected to group of devices 706 in FIG. 7 have been grouped to form breakout segment 810. An end portion of each of these two segments may then break away from breakout segment 810 at second breakout level 600 to form group of breakout segments 812 that connect to group of devices 706.

Lastly, the two segments that connected to group of devices 708 in FIG. 7 have been grouped to form breakout segment 814. An end portion of each of these two segments may then break away from breakout segment 814 at second breakout level 600 to form group of breakout segments 816 that connect to group of devices 708.

Figure 9:
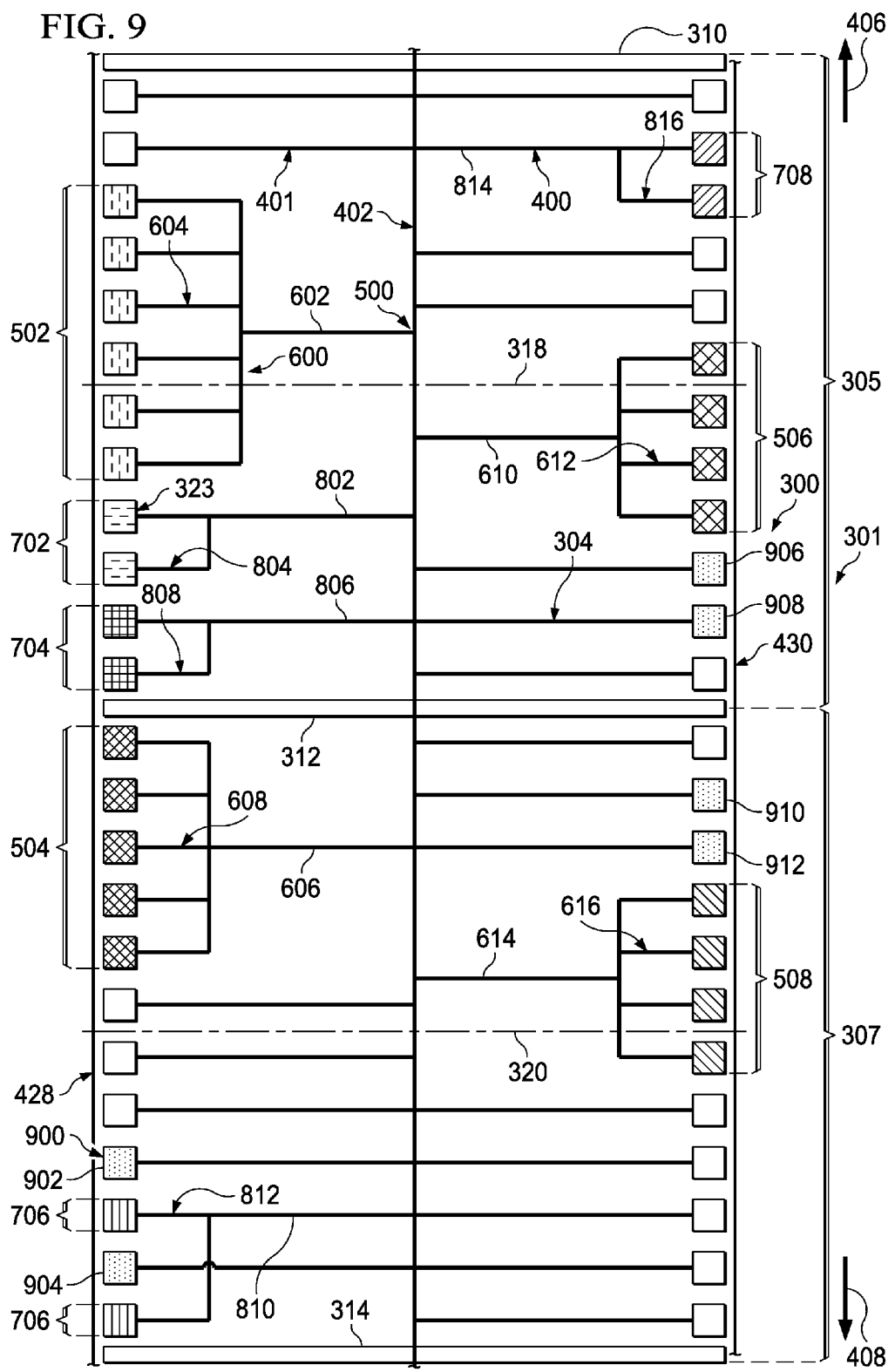
FIG. 9 is an illustration of the identification of non-groupable devices in accordance with an illustrative embodiment.

With reference now to FIG. 9, an illustration of the identification of non-groupable devices is depicted in accordance with an illustrative embodiment. In this illustrative example, any devices in plurality of devices 323 that should not be grouped with other devices are identified.

For example, set of non-groupable devices 900 is identified. Set of non-groupable devices 900 includes device 902, device 904, device 906, device 908, device 910, and device 912. These devices are of a type that may require that the segments connecting to these devices not be grouped with other segments.

Depending on the implementation, this layout for wire harness 401 may be the final layout formed for wire harness 401. In other illustrative examples, a number of additional steps may be performed to further group devices in plurality of devices 323 and optimize the final layout of wire harness 401.

The number of final breakout segments at first breakout level 500 in the final layout generated may be reduced as compared to the number of breakout segments extending from trunk 402 in FIG. 4. Further, an additional level, second breakout level 600, has been created in the final layout. In some cases, segments may break away from a breakout segment at a second breakout level, such as second breakout level 600, to connect to devices, thus forming a third breakout level. This third breakout level may also be referred to as a device breakout level.

Figure 10:
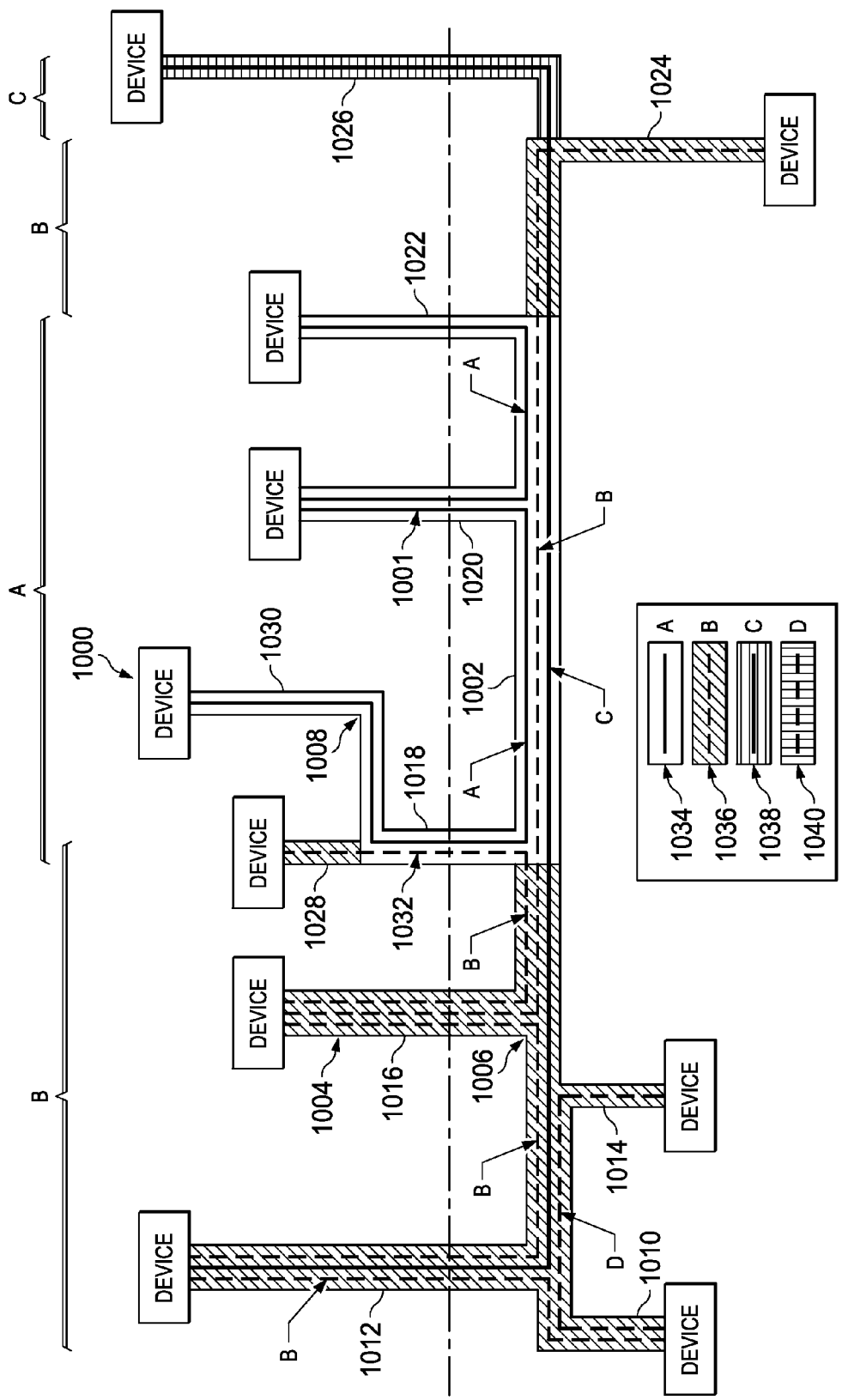
FIG. 10 is an illustration a tree-like layout with electrical separation requirements for a wire harness in accordance with an illustrative embodiment.

With reference now to FIG. 10, an illustration a tree-like layout with electrical separation requirements for a wire harness is depicted in accordance with an illustrative embodiment. In this illustrative example, tree-like layout 1000 is an example of one implementation for tree-like layout 140 in FIG. 1. Tree-like layout 1000 is the layout that may be used for wire harness 1001. Wire harness 1001 may be an example of one implementation for one of plurality of wire harnesses 125 in FIG. 1.

In this illustrative example, tree-like layout 1000 includes trunk 1002 and plurality of segments 1004 that break away from trunk 1002. In particular, tree-like layout 1000 has first breakout level 1006 and second breakout level 1008. First breakout level 1006 includes breakout segments 1010, 1012, 1014, 1016, 1018, 1020, 1022, 1024, and 1026. Second breakout level 1008 includes segment 1028 and segment 1030.

As depicted, wire harness 1001 is comprised of wires 1032 that join and then leave trunk 1002 at different points along trunk 1002. Each of wires 1032 may have a particular electrical separation requirement. In this illustrative example, a first portion of wires 1032 has first separation requirement 1034; a second portion of wires 1032 has second separation requirement 1036; a third portion of wires 1032 has third separation requirement 1038; and a fourth portion of wires 1032 has fourth separation requirement 1040. First separation requirement 1034 may be stricter than second separation requirement 1036. Second separation requirement 1036 may be stricter than third separation requirement 1038, which may be stricter than fourth separation requirement 1040.

In this illustrative example, first separation requirement 1034, the greatest of the four separation requirements, is not applied to all of wires 1032 and thereby, wire harness 1001. Rather, the strictest separation requirement of the one or more wires in each individual segment in plurality of segments 1004 is applied to that individual segment.

For example, the strictest separation requirement of the wires in breakout segment 1020 is first separation requirement 1034. Consequently, first separation requirement 1034 is applied to all of breakout segment 1020. However, the strictest separation requirement of the wires in breakout segment 1016 is second separation requirement 1036. Consequently, second separation requirement 1036 is applied to all of breakout segment 1020.

Further, the strictest separation requirement of the wires in breakout segment 1010 is third separation requirement 1038. Consequently, third separation requirement 1038 is applied to all of breakout segment 1010.

This type of application of separation requirements is also used at second breakout level 1008. In this illustrative example, segment 1028 and segment 1030 at second breakout level 1008 each have only one wire. The separation requirement of the sole wire in segment 1028 is applied to segment 1028 and the separation requirement of the sole wire in segment 1030 is applied to segment 1030.

Further, as depicted, as wires join and leave trunk 1002 along the length of trunk 1002, the strictest separation requirement for the wires in trunk 1002 changes along the length of trunk 1002. Different portions of trunk 1002 are assigned the corresponding strictest requirements. In this manner, the strictest separation requirement, first separation requirement 1034, is not applied to the entirety of trunk.

Figure 11A:
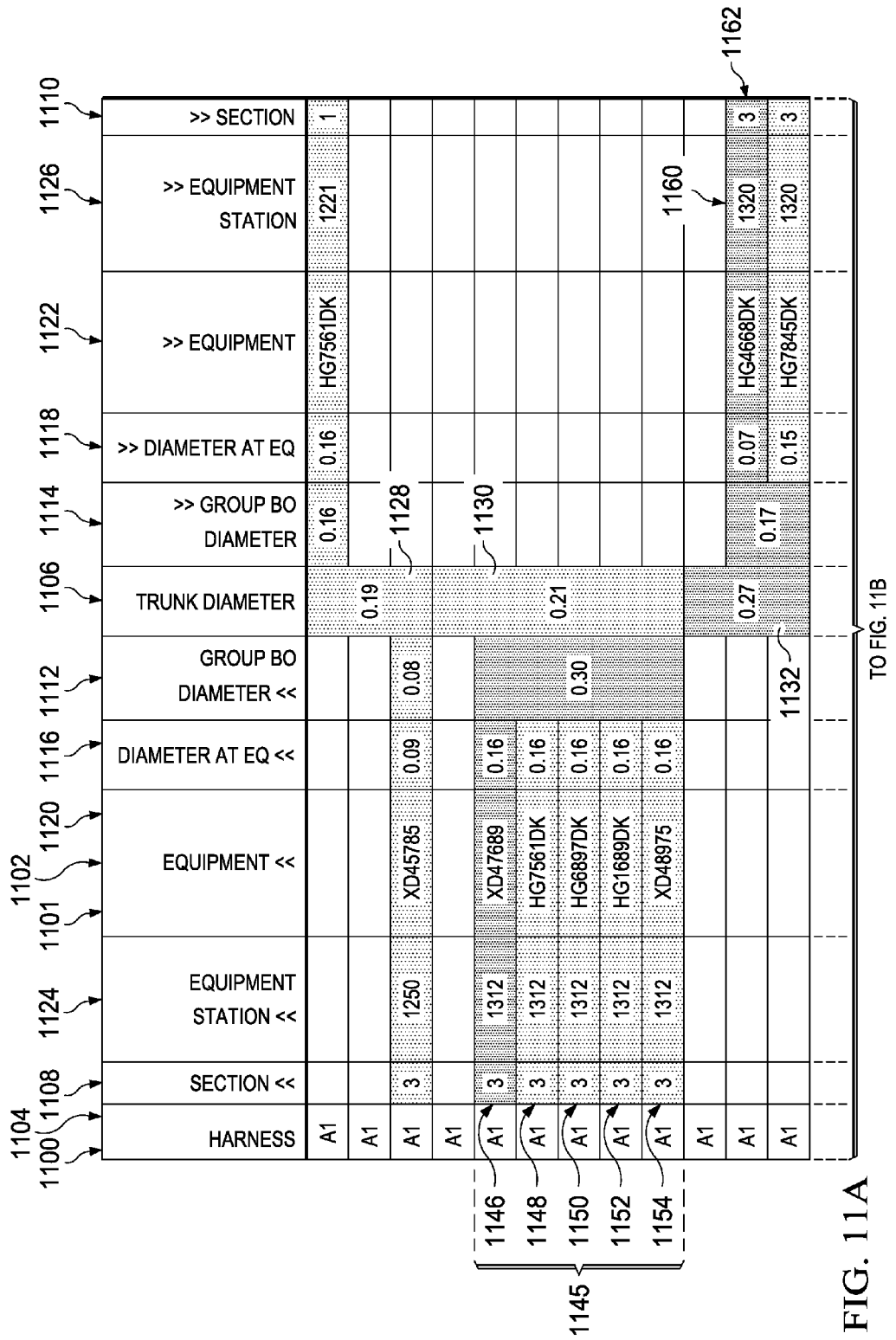

With reference now to FIGS. 11A and 11B, an illustration of a display of a portion of a layout output is depicted in accordance with an illustrative embodiment. In this illustrative example, display 1100 may be an example of one implementation for display 158 in FIG. 1. Display 1100 may visually present layout output 1101, which may be an example of one implementation for one of plurality of layout outputs 134 in FIG. 1. Layout output 1101 corresponds to a particular wire harness.

As depicted, layout output 1101 is presented in the form of a table having plurality of columns 1102 and plurality of rows 1103. Plurality of columns 1102 includes harness 1104, trunk diameter 1106, section 1108, section 1110, breakout diameter 1112, breakout diameter 1114, diameter at equipment 1116, diameter at equipment 1118, equipment 1120, equipment 1122, equipment station 1124, and equipment station 1126.

Harness 1104 may identify the particular wire harness to which layout output 1101 corresponds. Trunk diameter 1106 indicates the diameter of a trunk for the wire harness. As depicted, the diameter of the trunk may change along the length of the trunk as wires join and leave the trunk. Plurality of rows 1103 represents the forward-to-aft direction from top-to bottom.

Identical columns are present to the left of trunk diameter 1106 and to the right of trunk diameter 1106. The columns in plurality of columns 1102 to the left of trunk diameter 1106 may correspond to the segments that break away from the trunk of the wire harness and extend towards the right with respect to the aircraft. The columns in plurality of columns 1102 to the right of trunk diameter 1106 may correspond to the segments that break away from the trunk of the wire harness and extend towards the left with respect to the aircraft.

Section 1108 and section 1110 identify the particular fuselage section of the fuselage of the aircraft within which each of the corresponding portions and breakout segments are located. Breakout diameter 1112 and breakout diameter 1114 identify the overall diameter of a breakout segment. Diameter at equipment 1116 and diameter at equipment 1118 identify the diameter of a segment comprising one or more wires when the segment connects to a device.

Equipment 1120 and equipment 1122 identify the device or type of device to which a segment connects. Equipment station 1124 and equipment station 1126 identify the particular equipment station to which a breakout segment, and thereby the segments that breakout from the breakout segment, are assigned. The equipment station may be, for example, the location of the particular device or equipment to which a segment connects with respect to a coordinate system for the aircraft.

In this illustrative example, cells 1128, 1130, 1132, 1134, 1136, 1138, 1140, 1142, and 1144 represent the different portions of the trunk of the wire harness having different trunk diameters. Portion 1145 of layout output 1101 represents a breakout segment that breaks away from the trunk to the left. As depicted, this breakout segment has an overall diameter of about 0.30 inches.

Each of rows 1146, 1148, 1150, 1152, and 1154 within portion 1145 represent an individual segment that breaks away from the breakout segment represented by portion 1145. The breakout segment, and thereby the segments that break away from the breakout segment, are assigned to equipment station 1499, as indicated by equipment station 1124 within portion 1145.

The separation requirements corresponding to different portions of the wire harness are indicated by color-coding of the different portions of layout output 1101. For example, portion 1156 of layout output 1101 having first color 1158 may represent a first separation requirement. Portion 1160 of layout output 1101 having second color 1162 may represent a second separation requirement. Further, portion 1164 of layout output 1101 having third color 1166 may represent a third separation requirement.

In this manner, display 1100 of layout output 1101 may allow a human operator to quickly and easily understand the layout to be used for the corresponding wire harness in the installation context for aircraft 104, the volume of space to be occupied up by the corresponding wire harness, and the separation requirements for the corresponding wire harness.

Figure 12:
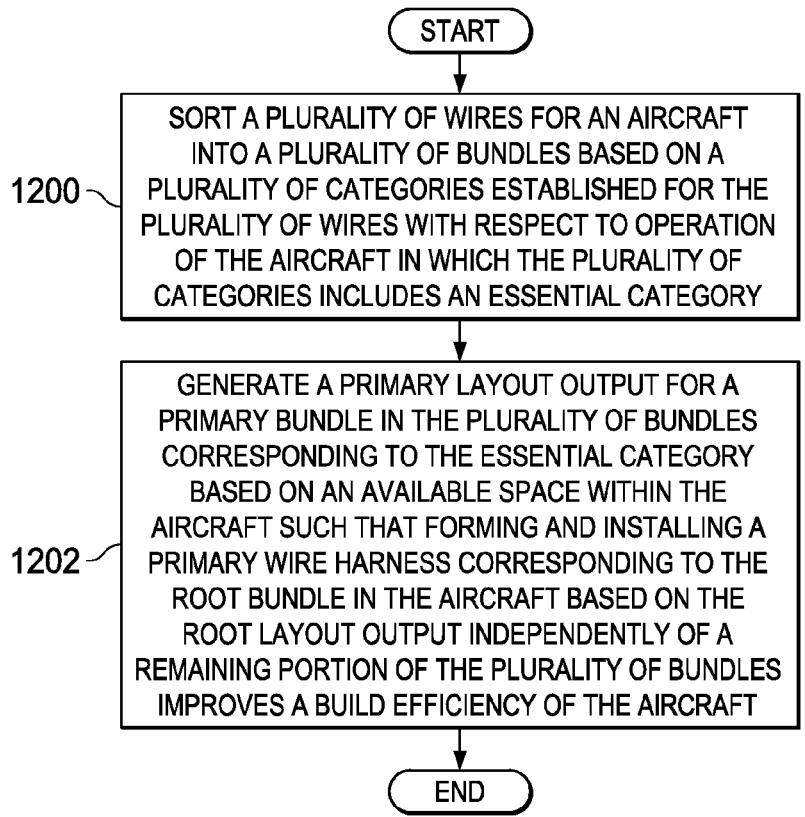
FIG. 12 is an illustration of a process for establishing a wire network for a platform in the form of a flowchart in accordance with an illustrative embodiment.

With reference now to FIG. 12, an illustration of a process for establishing a wire network for a platform is depicted in the form of a flowchart in accordance with an illustrative embodiment. The process illustrated in FIG. 12 may be used to establish a wire network, such as wire network 101 in FIG. 1, for a platform, such as platform 102 in FIG. 1. The platform may take the form of, for example, an aircraft, such as aircraft 104 in FIG. 1, or some other type of platform.

For example, the process may begin by sorting a plurality of wires for an aircraft into a plurality of bundles based on a plurality of categories established for the plurality of wires with respect to operation of the aircraft in which the plurality of categories includes an essential category (operation 1200). Next, a primary layout output is generated for a primary bundle in the plurality of bundles corresponding to the essential category based on an available space within the aircraft such that forming and installing a primary wire harness corresponding to the root bundle in the aircraft based on the root layout output independently of a remaining portion of the plurality of bundles improves a build efficiency of the aircraft (operation 1202), with the process terminating thereafter.

Figure 13:
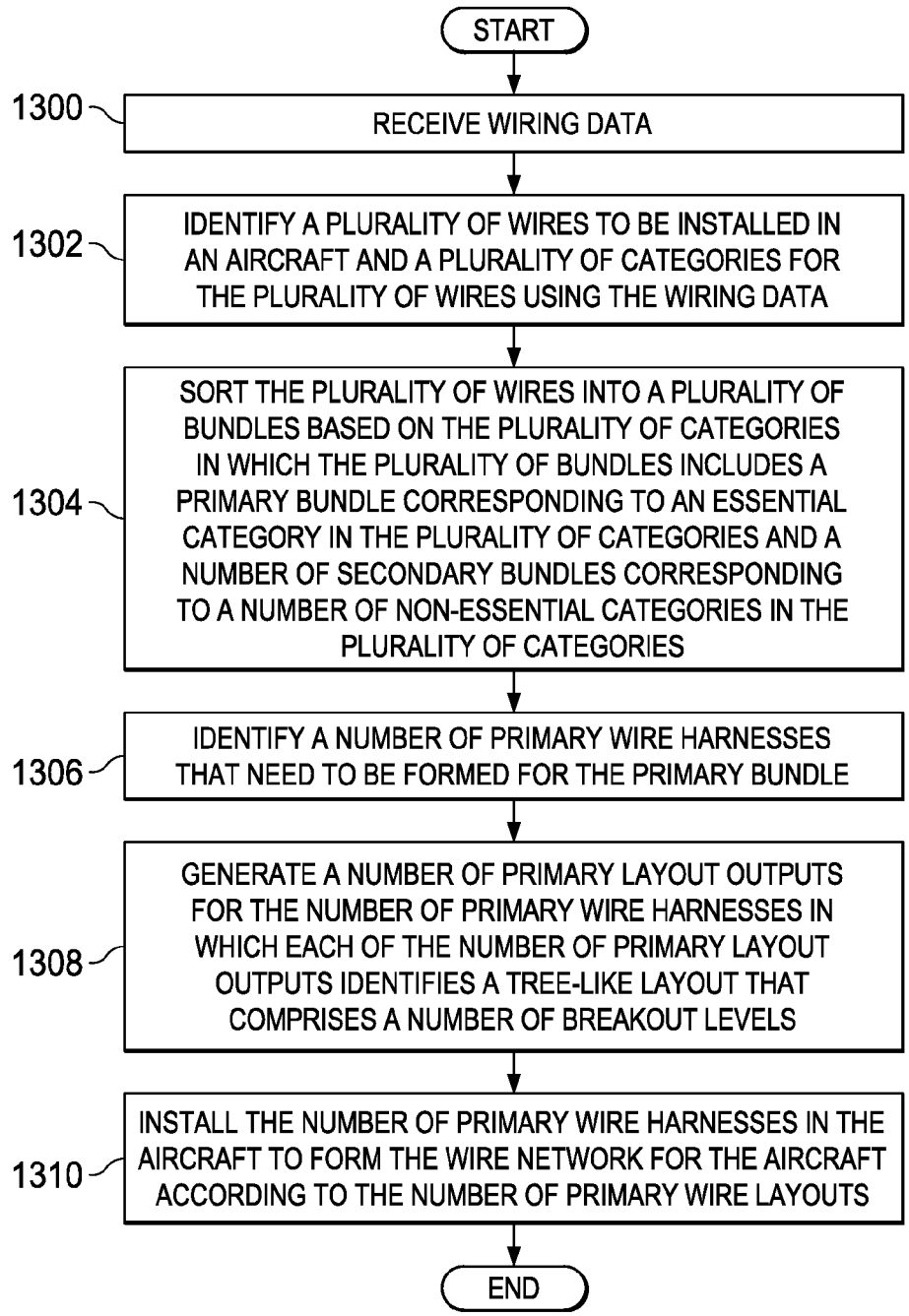
FIG. 13 is an illustration of a process for establishing a wire network for an aircraft in the form of a flowchart in accordance with an illustrative embodiment.

With reference now to FIG. 13, an illustration of a process for establishing a wire network for an aircraft is depicted in the form of a flowchart in accordance with an illustrative embodiment. The process illustrated in FIG. 13 may be an example of one manner in which wire network 101 may be established for aircraft 104 in FIG. 1.

The process may begin by receiving wiring data (operation 1300). Next, a plurality of wires to be installed in an aircraft and a plurality of categories for the plurality of wires are identified using the wiring data (operation 1302).

Thereafter, the plurality of wires may be sorted into a plurality of bundles based on the plurality of categories in which the plurality of bundles includes a primary bundle corresponding to an essential category in the plurality of categories and a number of secondary bundles corresponding to a number of non-essential categories in the plurality of categories (operation 1304). A number of primary wire harnesses that need to be formed for the primary bundle are identified (operation 1306).

Next, a number of primary layout outputs are generated for the number of primary wire harnesses in which each of the number of primary layout outputs identifies a tree-like layout that comprises a number of breakout levels (operation 1308). The number of primary wire harnesses is then installed in the aircraft to form the wire network for the aircraft according to the number of primary wire layouts (operation 1310), with the process terminating thereafter.

Any number of operations may be performed prior to the wire installation in operation 1310. For example, number of primary layout outputs may be evaluated in the installation context and used to determine whether any aircraft design changes need to be made to accommodate each tree-like layout for each primary wire harness. In some cases, the number of primary layout outputs may need to be modified to account for design constraints or physical constraints for the aircraft. The number of primary layout outputs may be modified to optimize any number of parameters or meet any number of criteria before the installation of the number of primary wire harnesses is performed in operation 1310.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, a portion of an operation or step, some combination thereof.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 14:
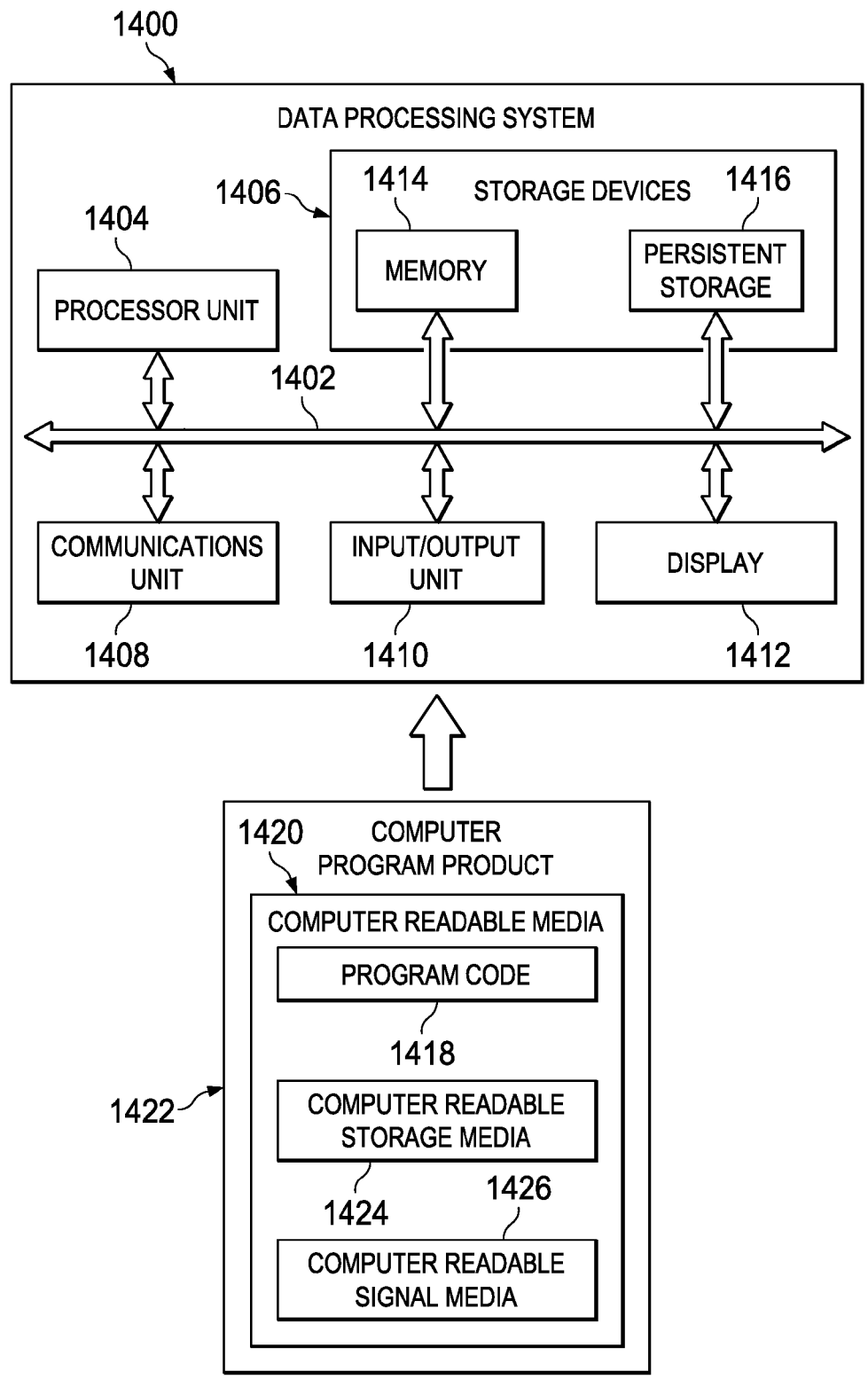
FIG. 14 is an illustration of a data processing system in the form of a block diagram in accordance with an illustrative embodiment.

Turning now to FIG. 14, an illustration of a data processing system is depicted in the form of a block diagram in accordance with an illustrative embodiment. Data processing system 1400 may be used to implement computer system 105 in FIG. 1. As depicted, data processing system 1400 includes communications framework 1402, which provides communications between processor unit 1404, storage devices 1406, communications unit 1408, input/output unit 1410, and display 1412. In some cases, communications framework 1402 may be implemented as a bus system.

Processor unit 1404 is configured to execute instructions for software to perform a number of operations. Processor unit 1404 may comprise at least one of a number of processors, a multi-processor core, or some other type of processor, depending on the implementation. In some cases, processor unit 1404 may take the form of a hardware unit, such as a circuit system, an application specific integrated circuit (ASIC), a programmable logic device, or some other suitable type of hardware unit.

Instructions for the operating system, applications and programs run by processor unit 1404 may be located in storage devices 1406. Storage devices 1406 may be in communication with processor unit 1404 through communications framework 1402. As used herein, a storage device, also referred to as a computer readable storage device, is any piece of hardware capable of storing information on a temporary basis, a permanent basis, or both. This information may include, but is not limited to, data, program code, other information, or some combination thereof.

Memory 1414 and persistent storage 1416 are examples of storage devices 1406. Memory 1414 may take the form of, for example, a random access memory or some type of volatile or non-volatile storage device. Persistent storage 1416 may comprise any number of components or devices. For example, persistent storage 1416 may comprise a hard drive, a flash memory, a rewritable optical disk, a rewritable magnetic tape, or some combination of the above. The media used by persistent storage 1416 may or may not be removable.

Communications unit 1408 allows data processing system 1400 to communicate with other data processing systems, devices, or both. Communications unit 1408 may provide communications using physical communications links, wireless communications links, or both.

Input/output unit 1410 allows input to be received from and output to be sent to other devices connected to data processing system 1400. For example, input/output unit 1410 may allow user input to be received through a keyboard, a mouse, some other type of input device, or a combination thereof. As another example, input/output unit 1410 may allow output to be sent to a printer connected to data processing system 1400.

Display 1412 is configured to display information to a user. Display 1412 may comprise, for example, without limitation, a monitor, a touch screen, a laser display, a holographic display, a virtual display device, some other type of display device, or a combination thereof.

In this illustrative example, the processes of the different illustrative embodiments may be performed by processor unit 1404 using computer-implemented instructions. These instructions may be referred to as program code, computer usable program code, or computer readable program code and may be read and executed by one or more processors in processor unit 1404.

In these examples, program code 1418 is located in a functional form on computer readable media 1420, which is selectively removable, and may be loaded onto or transferred to data processing system 1400 for execution by processor unit 1404. Program code 1418 and computer readable media 1420 together form computer program product 1422. In this illustrative example, computer readable media 1420 may be computer readable storage media 1424 or computer readable signal media 1426.

Computer readable storage media 1424 is a physical or tangible storage device used to store program code 1418 rather than a medium that propagates or transmits program code 1418. Computer readable storage media 1424 may be, for example, without limitation, an optical or magnetic disk or a persistent storage device that is connected to data processing system 1400.

Alternatively, program code 1418 may be transferred to data processing system 1400 using computer readable signal media 1426. Computer readable signal media 1426 may be, for example, a propagated data signal containing program code 1418. This data signal may be an electromagnetic signal, an optical signal, or some other type of signal that can be transmitted over physical communications links, wireless communications links, or both.

The illustration of data processing system 1400 in FIG. 14 is not meant to provide architectural limitations to the manner in which the illustrative embodiments may be implemented. The different illustrative embodiments may be implemented in a data processing system that includes components in addition to or in place of those illustrated for data processing system 1400. Further, components shown in FIG. 14 may be varied from the illustrative examples shown.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus for establishing a wire network for an aircraft comprising:
   a wire manager that sorts a plurality of wires for the aircraft into a plurality of bundles based on a plurality of categories established for the plurality of wires with respect to operation of the aircraft, wherein the plurality of categories includes an essential category and wherein the plurality of bundles includes a primary bundle corresponding to the essential category; and
   a layout manager that generates a primary layout output for the primary bundle based on an available space within the aircraft,
      wherein forming and installing a primary wire harness corresponding to the primary bundle in the aircraft based on the primary layout output independently of a remaining portion of the plurality of bundles improves a build efficiency of the aircraft.

2. The apparatus of claim 1, wherein a number of secondary wire harnesses corresponding to the remaining portion of the plurality of bundles are formed and installed in the aircraft after installation of the primary wire harness and wherein the primary wire harness and the number of secondary wire harnesses form the wire network.

3. The apparatus of claim 2 further comprising:
   the aircraft, wherein the primary wire harness is installed in the aircraft based on the primary layout output at a primary wiring site and wherein the aircraft is sent to a number of secondary wiring sites for installation of the number of secondary wire harnesses.

4. The apparatus of claim 1, wherein the primary layout output reduces a volume of space needed for a corresponding number of essential wires within the primary wire harness within the aircraft.

5. The apparatus of claim 1, wherein the essential category is a continued safe flight and landing category.

6. The apparatus of claim 5, wherein the plurality of categories correspond to a plurality of levels of relative importance to the operation of the aircraft and wherein the plurality of categories includes the continued safe flight and landing category and at least one of an administratively regulated and required category, a flight crew mission performance category, a cabin crew mission performance category, a commercial mission category, an airline customization category, or a passenger comfort category.

7. The apparatus of claim 1, wherein the layout manager generates a visual representation of the primary layout output that allows visualization of a volume of space needed within the aircraft for the primary wire harness and separation requirements for a corresponding number of essential wires within the primary wire harness relative to an installation context for the aircraft.

8. The apparatus of claim 1, wherein the layout manager generates a number of secondary layout outputs and wherein forming and installing a number of secondary wire harnesses corresponding to a number of secondary bundles in the plurality of bundles based on the number of secondary layout outputs improves the build efficiency of the aircraft.

9. A method for establishing a wire network in an aircraft, the method comprising:
   sorting a plurality of wires for the aircraft into a plurality of bundles based on a plurality of categories established for the plurality of wires with respect to operation of the aircraft, wherein the plurality of categories includes an essential category; and generating a primary layout output for a primary bundle in the plurality of bundles corresponding to the essential category based on an available space within the aircraft, wherein forming and installing a primary wire harness corresponding to the primary bundle in the aircraft based on the primary layout output independently of a remaining portion of the plurality of bundles improves a build efficiency of the aircraft.

10. The method of claim 9 further comprising:

installing the primary wire harness in the aircraft based on the primary layout output at a primary wiring site; and installing a number of secondary wire harnesses corresponding to the remaining portion of the plurality of bundles in the aircraft at a number of secondary wiring sites.

11. The method of claim 9, wherein generating the primary layout output comprises:

identifying a vector for a trunk in a tree-like layout for the primary bundle based on locations of a plurality of devices to which wires in the primary bundle are to connect.

12. The method of claim 11, wherein generating the primary layout output further comprises:

identifying a number of breakout levels for the tree-like layout and a plurality of breakout segments for the tree-like layout based on the number of breakout levels.

13. The method of claim 12, wherein generating the primary layout output further comprises:

designating a set of breakout segments in the plurality of breakout segments to break away from the trunk within each of a plurality of frame bays within the aircraft.

14. The method of claim 13, wherein generating the primary layout output further comprises:

identifying a diameter for each of the plurality of breakout segments.

15. The method of claim 9 further comprising:

generating a visual representation of the primary layout output that allows visualization of a volume of space needed within the aircraft for the primary wire harness and separation requirements for a corresponding number of essential wires within the primary wire harness relative to an installation context for the aircraft.

16. The method of claim 9, wherein sorting the plurality of wires for the aircraft into the plurality of bundles based on the plurality of categories established for the plurality of wires with respect to the operation of the aircraft comprises:

identifying a portion of the plurality of wires corresponding to the essential category as the primary bundle, wherein the essential category is a continued safe flight and landing category; and assigning each wire in the portion identified to one of a number of primary wire harnesses to be formed and installed in the aircraft, wherein the primary wire harness is one of the number of primary wire harnesses.

17. The method of claim 16, wherein sorting the plurality of wires for the aircraft into the plurality of bundles based on the plurality of categories established for the plurality of wires with respect to the operation of the aircraft comprises:

sorting the plurality of wires for the aircraft into the plurality of bundles based on the plurality of categories, wherein the plurality of categories correspond to a plurality of levels of relative importance to the operation of the aircraft and wherein the plurality of categories includes the continued safe flight and landing category and at least one of an administratively regulated and required category, a flight crew mission performance category, a cabin crew mission performance category, a commercial mission category, an airline customization category, or a passenger comfort category.

18. A method for establishing a wire network for a platform, the method comprising:

sorting a plurality of wires for the platform into a plurality of bundles based on a plurality of categories established for the plurality of wires with respect to operation of the platform, wherein the plurality of categories includes an essential category; and generating a primary layout output for a primary bundle in the plurality of bundles corresponding to the essential category based on an available space within the platform, wherein forming and installing a primary wire harness corresponding to the primary bundle in the platform based on the primary layout output independently of a remaining portion of the plurality of bundles improves a build efficiency of the platform.

19. The method of claim 18 further comprising:

installing the primary wire harness in the platform based on the primary layout output at a primary wiring site; and installing a number of secondary wire harnesses corresponding to the remaining portion of the plurality of bundles in the platform at a number of secondary wiring sites.

20. The method of claim 18, wherein generating the primary layout output further comprises:

identifying a number of breakout levels for a tree-like layout for the primary bundle and a plurality of breakout segments for the tree-like layout based on the number of breakout levels; and designating a set of breakout segments in the plurality of breakout segments to break away from a trunk within each of a plurality of frame bays within the platform.

* * * * *